United States Patent
Sirski et al.

(10) Patent No.: US 12,325,996 B2
(45) Date of Patent: *Jun. 10, 2025

(54) SOLAR ROOFING SYSTEM WITH FIBER COMPOSITE ROOFING SHINGLES

(71) Applicant: GAF Energy LLC, Parsippany, NJ (US)

(72) Inventors: William Sirski, San Jose, CA (US); Ray Lu, Parsippany, NJ (US); David Kavulak, Fremont, CA (US); Thierry Nguyen, San Francisco, CA (US); Emma Dohner, San Francisco, CA (US); Caleb David Cheung, San Jose, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/352,894

(22) Filed: Jul. 14, 2023

(65) Prior Publication Data
US 2024/0018781 A1 Jan. 18, 2024

Related U.S. Application Data

(60) Provisional application No. 63/419,991, filed on Oct. 27, 2022, provisional application No. 63/419,165, (Continued)

(51) Int. Cl.
*E04D 1/28* (2006.01)
*B32B 5/12* (2006.01)
(Continued)

(52) U.S. Cl.
CPC ............... *E04D 1/28* (2013.01); *B32B 5/12* (2013.01); *B32B 7/027* (2019.01); *B32B 27/12* (2013.01);
(Continued)

(58) Field of Classification Search
CPC ....... E04D 1/28; E04D 1/30; E04D 2001/308; B32B 5/12; B32B 27/12; B32B 27/32;
(Continued)

(56) References Cited

U.S. PATENT DOCUMENTS 1,981,467 A 11/1934 Radtke
3,156,497 A 11/1964 Lessard
(Continued)

FOREIGN PATENT DOCUMENTS

CA 2829440 A 5/2019
CH 700095 A2 6/2010
(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.
(Continued)

*Primary Examiner* — Adriana Figueroa
(74) *Attorney, Agent, or Firm* — GREENBERG TRAURIG, LLP

(57) ABSTRACT

A system includes a plurality of photovoltaic modules configured to be installed on a roof deck and a plurality of roofing shingles. Each of roofing shingles includes a cap layer composed of a first polymer material, and a core layer underneath the cap layer. The core layer includes a first layer composed of a continuous fiber thermoplastic composite tape (CFT), a second layer composed of a continuous fiber thermoplastic composite tape (CFT), and a third layer between the first layer and the second layer. The third layer is composed of a second polymer material.

18 Claims, 11 Drawing Sheets

Related U.S. Application Data filed on Oct. 25, 2022, provisional application No. 63/389,671, filed on Jul. 15, 2022.

(51) Int. Cl.

| | | |
|---|---|---|
| *B32B 7/027* | (2019.01) | |
| *B32B 27/12* | (2006.01) | |
| *B32B 27/32* | (2006.01) | |
| *E04D 1/30* | (2006.01) | |
| *H02S 20/25* | (2014.01) | |
| *H02S 40/20* | (2014.01) | |

(52) U.S. Cl.
CPC ............... *B32B 27/32* (2013.01); *E04D 1/30* (2013.01); *H02S 20/25* (2014.12); *H02S 40/20* (2014.12); *B32B 2260/023* (2013.01); *B32B 2260/046* (2013.01); *B32B 2262/0253* (2013.01); *B32B 2274/00* (2013.01); *B32B 2307/308* (2013.01); *B32B 2307/546* (2013.01); *B32B 2307/7376* (2023.05); *B32B 2419/06* (2013.01); *E04D 2001/308* (2013.01)

(58) Field of Classification Search
CPC ........ B32B 2260/023; B32B 2260/046; B32B 2262/0253; B32B 2274/00; B32B 2307/308; B32B 2307/546; B32B 2307/7376; H02S 20/25
See application file for complete search history.

(56) References Cited

U.S. PATENT DOCUMENTS

| | | | | |
|---|---|---|---|---|
| 3,617,437 | A | * | 11/1971 | Bagg ...................... C04B 30/02 |
| | | | | 264/108 |
| 4,258,948 | A | | 3/1981 | Hoffmann |
| 4,278,720 | A | * | 7/1981 | Shannon .................. D04H 5/08 |
| | | | | 428/113 |
| 4,349,220 | A | | 9/1982 | Carroll et al. |
| 4,499,702 | A | | 2/1985 | Turner |
| 4,636,577 | A | | 1/1987 | Peterpaul |
| 5,043,207 | A | * | 8/1991 | Donovan ............... A47G 9/086 |
| | | | | 442/352 |
| 5,151,146 | A | * | 9/1992 | Green .................. D04H 1/4218 |
| | | | | 156/324 |
| 5,167,579 | A | | 12/1992 | Rotter |
| 5,437,735 | A | | 8/1995 | Younan et al. |
| 5,590,495 | A | | 1/1997 | Bressler et al. |
| 5,642,596 | A | | 7/1997 | Waddington |
| 5,872,067 | A | * | 2/1999 | Meng ...................... B29C 70/12 |
| | | | | 156/60 |
| 6,008,450 | A | | 12/1999 | Ohtsuka et al. |
| 6,033,270 | A | | 3/2000 | Stuart |
| 6,046,399 | A | | 4/2000 | Kapner |
| 6,320,114 | B1 | | 11/2001 | Kuechler |
| 6,320,115 | B1 | | 11/2001 | Kataoka et al. |
| 6,336,304 | B1 | | 1/2002 | Mimura et al. |
| 6,341,454 | B1 | | 1/2002 | Koleoglou |
| 6,407,329 | B1 | | 6/2002 | Iino et al. |
| 6,576,830 | B2 | | 6/2003 | Nagao et al. |
| 6,928,781 | B2 | | 8/2005 | Desbois et al. |
| 6,972,367 | B2 | | 12/2005 | Federspiel et al. |
| 7,138,578 | B2 | | 11/2006 | Komamine |
| 7,155,870 | B2 | | 1/2007 | Almy |
| 7,178,295 | B2 | | 2/2007 | Dinwoodie |
| 7,309,668 | B2 | * | 12/2007 | Wilson .................... B32B 11/10 |
| | | | | 442/388 |
| 7,487,771 | B1 | | 2/2009 | Eiffert et al. |
| 7,587,864 | B2 | | 9/2009 | McCaskill et al. |
| 7,678,990 | B2 | | 3/2010 | McCaskill et al. |
| 7,678,991 | B2 | | 3/2010 | McCaskill et al. |
| 7,748,191 | B2 | | 7/2010 | Podirsky |
| 7,819,114 | B2 | | 10/2010 | Augenbraun et al. |
| 7,824,191 | B1 | | 11/2010 | Podirsky |
| 7,832,176 | B2 | | 11/2010 | McCaskill et al. |
| 8,118,109 | B1 | | 2/2012 | Hacker |
| 8,168,880 | B2 | | 5/2012 | Jacobs et al. |
| 8,173,889 | B2 | | 5/2012 | Kalkanoglu et al. |
| 8,210,570 | B1 | | 7/2012 | Railkar et al. |
| 8,276,329 | B2 | | 10/2012 | Lenox |
| 8,312,693 | B2 | | 11/2012 | Cappelli |
| 8,319,093 | B2 | | 11/2012 | Kalkanoglu et al. |
| 8,333,040 | B2 | | 12/2012 | Shiao et al. |
| 8,371,076 | B2 | | 2/2013 | Jones et al. |
| 8,375,653 | B2 | | 2/2013 | Shiao et al. |
| 8,404,967 | B2 | | 3/2013 | Kalkanoglu et al. |
| 8,410,349 | B2 | | 4/2013 | Kalkanoglu et al. |
| 8,418,415 | B2 | | 4/2013 | Shiao et al. |
| 8,438,796 | B2 | | 5/2013 | Shiao et al. |
| 8,468,754 | B2 | | 6/2013 | Railkar et al. |
| 8,468,757 | B2 | | 6/2013 | Krause et al. |
| 8,505,249 | B2 | | 8/2013 | Geary |
| 8,512,866 | B2 | | 8/2013 | Taylor |
| 8,513,517 | B2 | | 8/2013 | Kalkanoglu et al. |
| 8,586,856 | B2 | | 11/2013 | Kalkanoglu et al. |
| 8,601,754 | B2 | | 12/2013 | Jenkins et al. |
| 8,629,578 | B2 | | 1/2014 | Kurs et al. |
| 8,646,228 | B2 | | 2/2014 | Jenkins |
| 8,656,657 | B2 | | 2/2014 | Livsey et al. |
| 8,671,630 | B2 | | 3/2014 | Lena et al. |
| 8,677,702 | B2 | | 3/2014 | Jenkins |
| 8,695,289 | B2 | | 4/2014 | Koch et al. |
| 8,713,858 | B1 | | 5/2014 | Xie |
| 8,713,860 | B2 | | 5/2014 | Railkar et al. |
| 8,733,038 | B2 | | 5/2014 | Kalkanoglu et al. |
| 8,789,321 | B2 | | 7/2014 | Ishida |
| 8,793,940 | B2 | | 8/2014 | Kalkanoglu et al. |
| 8,793,941 | B2 | | 8/2014 | Bosler et al. |
| 8,826,607 | B2 | | 9/2014 | Shiao et al. |
| 8,835,751 | B2 | | 9/2014 | Kalkanoglu et al. |
| 8,863,451 | B2 | | 10/2014 | Jenkins et al. |
| 8,898,970 | B2 | | 12/2014 | Jenkins et al. |
| 8,925,262 | B2 | | 1/2015 | Railkar et al. |
| 8,943,766 | B2 | | 2/2015 | Gombarick et al. |
| 8,946,544 | B2 | | 2/2015 | Jabos et al. |
| 8,950,128 | B2 | | 2/2015 | Kalkanoglu et al. |
| 8,959,848 | B2 | | 2/2015 | Jenkins et al. |
| 8,966,838 | B2 | | 3/2015 | Jenkins |
| 8,966,850 | B2 | | 3/2015 | Jenkins et al. |
| 8,994,224 | B2 | | 3/2015 | Mehta et al. |
| 9,032,672 | B2 | | 5/2015 | Livsey et al. |
| 9,166,087 | B2 | | 10/2015 | Chihlas et al. |
| 9,169,646 | B2 | | 10/2015 | Rodrigues et al. |
| 9,170,034 | B2 | | 10/2015 | Bosler et al. |
| 9,178,465 | B2 | | 11/2015 | Shiao et al. |
| 9,202,955 | B2 | | 12/2015 | Livsey et al. |
| 9,212,832 | B2 | | 12/2015 | Jenkins |
| 9,217,584 | B2 | | 12/2015 | Kalkanoglu et al. |
| 9,270,221 | B2 | | 2/2016 | Zhao |
| 9,273,885 | B2 | | 3/2016 | Rordigues et al. |
| 9,276,141 | B2 | | 3/2016 | Kalkanoglu et al. |
| 9,331,224 | B2 | | 5/2016 | Koch et al. |
| 9,356,174 | B2 | | 5/2016 | Duarte et al. |
| 9,359,014 | B1 | | 6/2016 | Yang et al. |
| 9,412,890 | B1 | | 8/2016 | Meyers |
| 9,528,270 | B2 | | 12/2016 | Jenkins et al. |
| 9,605,432 | B1 | | 3/2017 | Robbins |
| 9,711,672 | B2 | | 7/2017 | Wang |
| 9,755,573 | B2 | | 9/2017 | Livsey et al. |
| 9,786,802 | B2 | | 10/2017 | Shiao et al. |
| 9,831,818 | B2 | | 11/2017 | West |
| 9,912,284 | B2 | | 3/2018 | Svec |
| 9,923,515 | B2 | | 3/2018 | Rodrigues et al. |
| 9,938,729 | B2 | | 4/2018 | Coon |
| 9,991,412 | B2 | | 6/2018 | Gonzalez et al. |
| 9,998,067 | B2 | | 6/2018 | Kalkanoglu et al. |
| 10,027,273 | B2 | | 7/2018 | West et al. |
| 10,115,850 | B2 | | 10/2018 | Rodrigues et al. |
| 10,128,660 | B1 | | 11/2018 | Apte et al. |
| 10,156,075 | B1 | | 12/2018 | McDonough |
| 10,187,005 | B2 | | 1/2019 | Rodrigues et al. |
| 10,256,765 | B2 | | 4/2019 | Rodrigues et al. |
| 10,284,136 | B1 | | 5/2019 | Mayfield et al. |

(56) References Cited

U.S. PATENT DOCUMENTS

| | | |
|---|---|---|
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,177,639 B1 | 11/2021 | Nguyen et al. |
| 11,217,715 B2 | 1/2022 | Sharenko |
| 11,251,744 B1 | 2/2022 | Bunea et al. |
| 11,258,399 B2 | 2/2022 | Kalkanoglu et al. |
| 11,283,394 B2 | 3/2022 | Perkins et al. |
| 11,424,379 B2 | 8/2022 | Sharenko et al. |
| 11,431,280 B2 | 8/2022 | Liu et al. |
| 11,431,281 B2 | 8/2022 | Perkins et al. |
| 11,545,928 B2 * | 1/2023 | Perkins ............... E04D 1/20 |
| 2002/0053360 A1 | 5/2002 | Kinoshita et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2005/0030187 A1 | 2/2005 | Peress et al. |
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2006/0042683 A1 | 3/2006 | Gangemi |
| 2006/0046084 A1 | 3/2006 | Yang et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0035140 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2008/0315061 A1 | 12/2008 | Placer et al. |
| 2009/0000222 A1 | 1/2009 | Kalkanoglu et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0242381 A1 | 9/2010 | Jenkins |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0302859 A1 | 12/2011 | Crasnianski |
| 2012/0034799 A1 | 2/2012 | Hunt |
| 2012/0060902 A1 | 3/2012 | Drake |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pisikak et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0099411 A1 * | 4/2015 | Yang ............... D06M 17/10 428/317.1 |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0115275 A1 | 4/2018 | Flanigan et al. |
| 2018/0254738 A1 | 9/2018 | Yang et al. |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0255822 A1 * | 8/2019 | Wang ............... C08K 3/04 |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0115223 A1 | 4/2021 | Bonekamp et al. |
| 2021/0159353 A1 | 5/2021 | Li et al. |
| 2021/0343886 A1 | 11/2021 | Sharenko et al. |
| 2022/0149213 A1 | 5/2022 | Mensink et al. |

FOREIGN PATENT DOCUMENTS

| | | |
|---|---|---|
| CN | 202797032 U | 3/2013 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 2446481 A2 | 5/2012 |
| EP | 2784241 A1 | 10/2014 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |
| KR | 10-2019-0000367 A | 1/2019 |
| KR | 10-2253483 B1 | 5/2021 |

(56) References Cited

FOREIGN PATENT DOCUMENTS

| | | |
|---|---|---|
| NL | 2026856 B1 | 6/2022 |
| WO | 2011/049944 A1 | 4/2011 |
| WO | 2015/133632 A1 | 9/2015 |
| WO | 2019/201416 A1 | 10/2019 |
| WO | 2020-159358 A1 | 8/2020 |
| WO | 2021-247098 A1 | 12/2021 |

OTHER PUBLICATIONS

RGS Energy, 3.5kW Powerhouse 3.0 system installed in an afternoon; Jun. 7, 2019 <<facebook.com/RGSEnergy/>> retrieved Feb. 2, 2021.
Tesla, Solar Roof <<tesla.com/solarroof>> retrieved Feb. 2, 2021.
"Types of Roofing Underlayment", Owens Corning Roofing; <<https://www.owenscorning.com/en-us/roofing/tools/how-roofing-underlayment-helps-protect-your-home>> retrieved Nov. 1, 2021.

\* cited by examiner

SOLAR ROOFING SYSTEM WITH FIBER COMPOSITE ROOFING SHINGLES

CROSS-REFERENCE TO RELATED APPLICATION

This application is a Section 111(a) application relating to and claiming the benefit of commonly-owned, U.S. Provisional Patent Application Ser. No. 63/389,671, filed Jul. 15, 2022, entitled "SOLAR ROOFING SYSTEM WITH FIBER COMPOSITE ROOFING SHINGLES;" U.S. Provisional Patent Application Ser. No. 63/419,165, filed Oct. 25, 2022, entitled "SOLAR ROOFING SYSTEM WITH FIBER COMPOSITE ROOFING SHINGLES;" and U.S. Provisional Patent Application Ser. No. 63/419,991, filed Oct. 27, 2022, entitled "SOLAR ROOFING SYSTEM WITH FIBER COMPOSITE ROOFING SHINGLES," the contents of each of which are incorporated herein by reference in its entirety.

FIELD OF THE INVENTION

The present invention relates to roofing shingles, and, more particularly, cuttable roofing shingles with fiberglass that are aesthetically matched with photovoltaic modules.

BACKGROUND

Photovoltaic systems having solar panels are commonly installed on roofing of structures. What is needed are roofing shingles that are configured to aesthetically matched to photovoltaic modules.

SUMMARY

In some embodiments, a system comprises a plurality of photovoltaic modules configured to be installed on a roof deck; and a plurality of roofing shingles, wherein each of the plurality of roofing shingles includes a cap layer, wherein the cap layer is composed of a first polymer material, and a core layer underneath the cap layer, wherein the core layer includes: a first layer, wherein the first layer is composed of a continuous fiber thermoplastic composite tape (CFT), a second layer, wherein the second layer is composed of a continuous fiber thermoplastic composite tape (CFT), and a third layer between the first layer and the second layer, wherein the third layer is composed of a second polymer material.

In some embodiments, the first polymer material is thermoplastic polyolefin (TPO). In some embodiments, the second polymer material is thermoplastic polyolefin (TPO). In some embodiments, the first layer is composed of composed of a polypropylene continuous fiber, unidirectional reinforced thermoplastic composite tape (CFT). In some embodiments, the second layer is composed of composed of a polypropylene continuous fiber, unidirectional reinforced thermoplastic composite tape (CFT). In some embodiments, fibers of the continuous fiber thermoplastic composite tape (CFT) of the first layer extend in a first direction along a longitudinal axis of the roofing shingle, and wherein the fibers of the continuous fiber thermoplastic composite tape (CFT) of the second layer extend in the first direction. In some embodiments, fibers of the continuous fiber thermoplastic composite tape (CFT) of the first layer extend in a first direction transverse from a longitudinal axis of the roofing shingle, and wherein the fibers of the continuous fiber thermoplastic composite tape (CFT) of the second layer extend in the first direction. In some embodiments, fibers of the continuous fiber thermoplastic composite tape (CFT) of the first layer extend in a first direction along a longitudinal axis of the roofing shingle, and wherein the fibers of the continuous fiber thermoplastic composite tape (CFT) of the second layer extend in a second direction transverse from the first direction.

In some embodiments, the cap layer has a thickness of 10 mil to 50 mil. In some embodiments, each of the first layer of the core layer and the second layer of the core layer has a thickness of 4 mil to 15 mil. In some embodiments, the third layer has a thickness of 20 mil to 100 mil. In some embodiments, the roofing shingle as a thickness of 35 mil to 200 mil. In some embodiments, the third layer has a thickness that is greater than a combined thickness of the first layer, the second layer and the cap layer.

In some embodiments, the cap layer includes a first surface and a pattern printed on the first surface. In some embodiments, the pattern is a depiction of solar cells. In some embodiments, the cap layer is colored. In some embodiments, the cap layer includes a first surface, wherein the first surface is textured.

In some embodiments, the roofing shingle includes a flexural modulus that is higher than a flexural modulus of a roofing shingle that does not include the first layer and the second layer. In some embodiments, the roofing shingle includes a coefficient of thermal expansion (CTE) that is lower than a coefficient of thermal expansion (CTE) of a roofing shingle that does not include the first layer and the second layer.

In some embodiments, the roofing shingle includes a headlap portion. In some embodiments, the headlap portion includes at least the cap layer. In some embodiments, the headlap portion includes the second layer. In some embodiments, the headlap portion includes a nailing zone. In some embodiments, the first layer includes a first end, a second end opposite the first end, wherein the nailing zone extends from the first end to a first location between the first end and the second end. In some embodiments, the nailing zone has a width of 200 mm to 400 mm. In some embodiments, the roofing shingle is configured to receive at least one fastener within the nailing zone for installing the roofing shingle to a roof deck. In some embodiments, the roofing shingle is configured to receive the at least one fastener through the first layer and through the cap layer within the nailing zone.

In some embodiments, a roofing shingle comprises a cap layer, wherein the cap layer is composed of thermoplastic polyolefin (TPO), wherein the cap layer has a thickness of 10 mil to mil; and a core layer underneath the cap layer, wherein the core layer includes a first layer, wherein the first layer is composed of a polypropylene continuous fiber, unidirectional reinforced thermoplastic composite tape (CFT), wherein the first layer has a thickness of 4 mil to 15 mil, a second layer, wherein the second layer is composed of a polypropylene continuous fiber, unidirectional reinforced thermoplastic composite tape (CFT), wherein the second layer has a thickness of 4 mil to 15 mil, and a third layer between the first layer and the second layer, wherein the third layer is composed of thermoplastic polyolefin, and wherein the third layer is 20 mil to 100 mil, wherein the roofing shingle includes a flexural modulus that is higher than a flexural modulus of a roofing shingle that does not include the first layer and the second layer, and wherein the roofing shingle includes a coefficient of thermal expansion (CTE) that is lower than a coefficient of thermal expansion (CTE) of a roofing shingle that does not include the first layer and the second layer.

BRIEF DESCRIPTION OF THE DRAWINGS

FIGS. 9 through 13F show some embodiments of a roofing shingle; and

DETAILED DESCRIPTION

Figure 1:
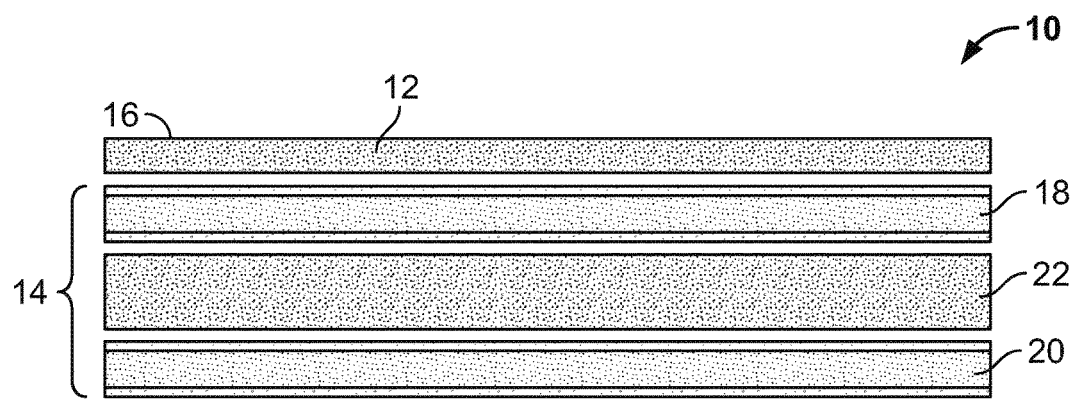
FIG. 1 is a schematic view of some embodiments of a roofing shingle.
Figure 2:
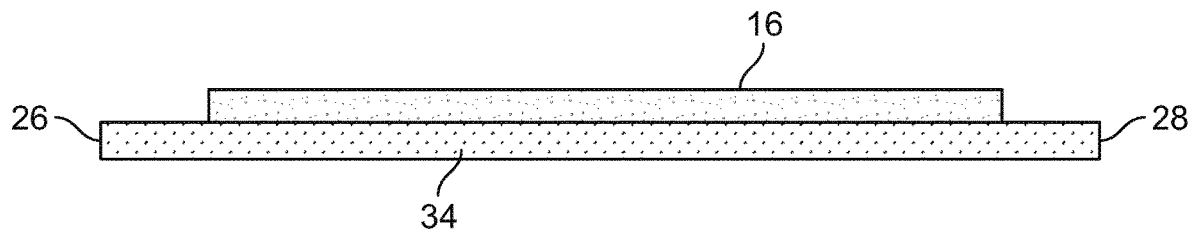
FIG. 2 is a side elevational view of some embodiments of a roofing shingle.
Figure 3:
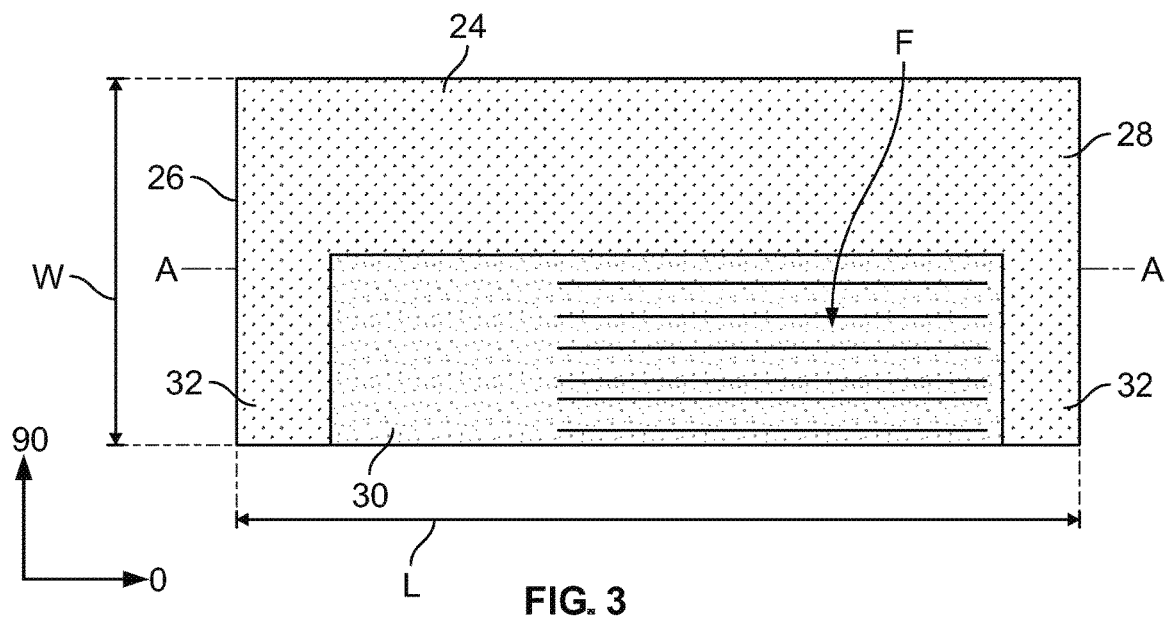
FIG. 3 is top plan view of the roofing shingle shown in FIG. 2.

Referring to FIGS. 1 through 3, in some embodiments, a roofing shingle 10 includes a cap layer 12 (frontsheet) and a core layer 14. In some embodiments, the core layer 14 is underneath the cap layer 12. In some embodiments, the cap layer 12 overlays the core layer 14. In some embodiments, the cap layer 12 is juxtaposed with the core layer 14. In some embodiments, the cap layer 12 and the core layer 14 are thermally bonded to one another. In some embodiments, the cap layer 12 and the core layer 14 are heat welded to one another. In some embodiments, the cap layer 12 and the core layer 14 are ultrasonically welded to one another. In some embodiments, the cap layer 12 and the core layer 14 are laminated. In some embodiments, the cap layer 12 is attached to the core layer 14 by and adhesive. In some embodiments, the cap layer 12 and the core layer 14 are mechanically attached to one another. In some embodiments, the roofing shingle 10 does not include a solar cell, a photovoltaic cell, or any electrical device that converts the energy of light into electricity. In some embodiments, the roofing shingle 10 does not include any electrically active components.

In some embodiments, the cap layer 12 is composed of a polymeric material. In some embodiments, the cap layer 12 is a polymeric material composed of thermoplastic polyolefin (TPO). In some embodiments, the cap layer 12 is composed of a single ply TPO roofing membrane. In other embodiments, non-limiting examples of TPO membranes are disclosed in U.S. Pat. No. 9,359,014 to Yang et al., which is incorporated by reference herein in its entirety. In some embodiments, the cap layer 12 is a polymeric material composed of polyethylene ("PE"). In some embodiments, the cap layer 12 is a polymeric material composed of polypropylene ("PP"). In some embodiments, the cap layer 12 is a polymeric material composed of polyester (polyethylene terephthalate). In some embodiments, the cap layer 12 is a polymeric material composed of polyethylene terephthalate ("PET"). In some embodiments, the cap layer 12 is a polymeric material composed of ethylene tetrafluoroethylene ("ETFE"). In some embodiments, the cap layer 12 is a polymeric material composed of an acrylic such as polymethyl methacrylate ("PMMA"). In some embodiments, the cap layer 12 is a polymeric material composed of polyvinyl chloride (PVC). In some embodiments, the cap layer 12 is a polymeric material composed of ethylene propylene diene monomer (EPDM) rubber. In some embodiments, the cap layer 12 is a polymeric material composed of recycled rubber. In some embodiments, the cap layer 12 is a polymeric material composed of modified bitumen. In some embodiments, the cap layer 12 is a polymeric material composed of asphalt. In some embodiments, the cap layer 12 is a polymeric material composed of a non-asphalt (NAS) roofing material. In some embodiments, the cap layer 12 includes a flame retardant additive. In some embodiments, the flame retardant additive may be clays, nanoclays, silicas, carbon black, metal hydroxides such as aluminum hydroxide and aluminum trihydroxide (ATH), metal foils, graphite, and combinations thereof. In some embodiments, the cap layer 12 includes a UV resistant material. In some embodiments, the cap layer 12 includes a UV resistant coating. In some embodiments, the cap layer 12 includes a thermal stabilizer. In some embodiments, the cap layer 12 is composed of a water-resistant material.

In some embodiments, the roofing shingle 10 is textured. In some embodiments, the roofing shingle 10 is textured to impart an appearance of a traditional asphalt roofing shingle. In some embodiments, the cap layer 12 includes a first surface 16. In some embodiments, the first surface 16 of the cap layer 12 is textured. In some embodiments, the first surface 16 of the cap layer 12 is textured by embossing. In some embodiments, the first surface 16 of the cap layer 12 is textured by molding. In some embodiments, the first surface 16 of the cap layer 12 is textured. In some embodiments, the first surface 16 of the cap layer 12 is textured by etching. In some embodiments, the first surface 16 of the cap layer 12 is textured. In some embodiments, the first surface 16 of the cap layer 12 is textured by laser surface texturing. In some embodiments, the first surface 16 includes a plurality of indentations. In some embodiments, the plurality of indentations includes a plurality of channels. In some embodiments, the plurality of channels is formed in a pattern. In some embodiments, each of the plurality of channels is random in size, shape and location. In some embodiments, the first surface 16 includes a matte surface texture. In some embodiments, the first surface 16 includes a glossy surface.

In some embodiments, a pattern is printed on a first surface 16 of the cap layer 12. In some embodiments, a pattern or depiction of solar cells is printed on the first surface 16 of the cap layer 12. In some embodiments, the pattern or depiction of solar cells includes a depiction of a plurality of cell fingers. In some embodiments, the pattern is printed on the first surface 16 of the cap layer 12 by ink jet printing. In some embodiments, the pattern is printed on the first surface 16 of the cap layer 12 by laser printing. In some embodiments, the pattern is printed on the first surface 16 of the cap layer 12 by lithography. In some embodiments, the pattern is printed on the first surface 16 of the cap layer 12 by lithography. In some embodiments, the pattern is printed on the first surface 16 of the cap layer 12 by offset printing. In some embodiments, the pattern is printed on the first surface 16 of the cap layer 12 by screen printing. In some embodiments, the pattern is printed on the first surface 16 of the cap layer 12 by digital printing. In another embodiment, the cap layer 12 is painted. In another embodiment, the cap layer 12 is a colored layer. In another embodiment, the cap layer 12 includes a black color. In some embodiments, the color of the cap layer 12 includes a mixture of colors. In some embodiments, the cap layer 12 includes an infrared reflective pigment. In some embodiments, the infrared reflective pigment includes graphene. In some embodiments, the roofing shingle 10 meets standards of California Building Energy Efficiency Standards of Residential and Nonresidential Buildings, Title 24, Part 6.

In an embodiment, the cap layer 12 includes a matte surface texture. In some embodiments, the cap layer 12 includes a matte film. In some embodiments, the matte film includes matte ETFE. In another embodiment, the matte film includes a coated film. In some embodiments, the cap layer 12 includes a smooth surface. In some embodiments, the cap layer 12 includes a glossy material, such as a shiny film, gloss patterned glass, or a gloss non-patterned glass. In some embodiments, the roofing shingle 10 having a textured cap layer 12 is an element of the system including a plurality of the roofing shingles 10, in which adjacent roofing shingles 10 have textured surfaces that are patterned differently from one another, thereby imparting a random-seeming appearance to the system.

In some embodiments, the cap layer 12 has a thickness of 10 mil to 60 mil. In some embodiments, the cap layer 12 has a thickness of 10 mil to 55 mil. In some embodiments, the cap layer 12 has a thickness of 10 mil to 50 mil. In some embodiments, the cap layer 12 has a thickness of 10 mil to 45 mil. In some embodiments, the cap layer 12 has a thickness of 10 mil to 40 mil. In some embodiments, the cap layer 12 has a thickness of 10 mil to 35 mil. In some embodiments, the cap layer 12 has a thickness of 10 mil to 30 mil. In some embodiments, the cap layer 12 has a thickness of 10 mil to 25 mil. In some embodiments, the cap layer 12 has a thickness of 10 mil to mil. In some embodiments, the cap layer 12 has a thickness of 10 mil to 15 mil. In some embodiments, the cap layer 12 has a thickness of 15 mil to 60 mil. In some embodiments, the cap layer 12 has a thickness of 15 mil to 55 mil. In some embodiments, the cap layer 12 has a thickness of 15 mil to 50 mil. In some embodiments, the cap layer 12 has a thickness of 15 mil to 45 mil. In some embodiments, the cap layer 12 has a thickness of 15 mil to 40 mil. In some embodiments, the cap layer 12 has a thickness of 15 mil to 35 mil. In some embodiments, the cap layer 12 has a thickness of 15 mil to 30 mil. In some embodiments, the cap layer 12 has a thickness of 15 mil to mil. In some embodiments, the cap layer 12 has a thickness of 15 mil to 20 mil. In some embodiments, the cap layer 12 has a thickness of 20 mil to 60 mil. In some embodiments, the cap layer 12 has a thickness of 10 mil to 55 mil. In some embodiments, the cap layer 12 has a thickness of 20 mil to 50 mil. In some embodiments, the cap layer 12 has a thickness of 20 mil to 45 mil. In some embodiments, the cap layer 12 has a thickness of 20 mil to 40 mil. In some embodiments, the cap layer 12 has a thickness of 20 mil to 35 mil. In some embodiments, the cap layer 12 has a thickness of 20 mil to 30 mil. In some embodiments, the cap layer 12 has a thickness of 20 mil to mil. In some embodiments, the cap layer 12 has a thickness of 25 mil to 60 mil. In some embodiments, the cap layer 12 has a thickness of 25 mil to 55 mil. In some embodiments, the cap layer 12 has a thickness of 25 mil to 50 mil. In some embodiments, the cap layer 12 has a thickness of 25 mil to 45 mil. In some embodiments, the cap layer 12 has a thickness of 25 mil to 40 mil. In some embodiments, the cap layer 12 has a thickness of 25 mil to 35 mil. In some embodiments, the cap layer 12 has a thickness of 25 mil to 30 mil. In some embodiments, the cap layer 12 has a thickness of 30 mil to 60 mil. In some embodiments, the cap layer 12 has a thickness of 30 mil to mil. In some embodiments, the cap layer 12 has a thickness of 30 mil to 50 mil. In some embodiments, the cap layer 12 has a thickness of 30 mil to 45 mil. In some embodiments, the cap layer 12 has a thickness of 30 mil to 40 mil. In some embodiments, the cap layer 12 has a thickness of 30 mil to 35 mil. In some embodiments, the cap layer 12 has a thickness of 35 mil to 60 mil. In some embodiments, the cap layer 12 has a thickness of 35 mil to 55 mil. In some embodiments, the cap layer 12 has a thickness of 35 mil to 50 mil. In some embodiments, the cap layer 12 has a thickness of 35 mil to 45 mil. In some embodiments, the cap layer 12 has a thickness of 35 mil to mil.

In some embodiments, the cap layer 12 has a thickness of 40 mil to 60 mil. In some embodiments, the cap layer 12 has a thickness of 40 mil to 55 mil. In some embodiments, the cap layer 12 has a thickness of 40 mil to 50 mil. In some embodiments, the cap layer 12 has a thickness of 40 mil to 45 mil. In some embodiments, the cap layer 12 has a thickness of 45 mil to 60 mil. In some embodiments, the cap layer 12 has a thickness of 45 mil to 55 mil. In some embodiments, the cap layer 12 has a thickness of 45 mil to 50 mil. In some embodiments, the cap layer 12 has a thickness of 50 mil to 60 mil. In some embodiments, the cap layer 12 has a thickness of 50 mil to 55 mil. In some embodiments, the cap layer 12 has a thickness of 55 mil to 60 mil.

In some embodiments, the cap layer 12 has a thickness of 10 mil. In some embodiments, the cap layer 12 has a thickness of 15 mil. In some embodiments, the cap layer 12 has a thickness of 20 mil. In some embodiments, the cap layer 12 has a thickness of 25 mil. In some embodiments, the cap layer 12 has a thickness of 30 mil. In some embodiments, the cap layer 12 has a thickness of 35 mil. In some embodiments, the cap layer 12 has a thickness of 40 mil. In some embodiments, the cap layer 12 has a thickness of 45 mil. In some embodiments, the cap layer 12 has a thickness of 50 mil.

Still referring to FIGS. 1 through 3, in some embodiments, the core layer 14 includes a first layer 18, a second layer 20, and a third layer 22. In some embodiments, the third layer 22 is between the first layer 18 and the second layer 20.

In some embodiments, the first layer 18 is composed of a continuous fiber thermoplastic composite tape (CFT). In some embodiments, the first layer 18 is composed of a polypropylene (PP) continuous fiber, unidirectional reinforced thermoplastic composite tape (CFT). In some embodiments, the first layer 18 is composed of a polyethylene terephthalate (PET) continuous fiber, unidirectional reinforced thermoplastic composite tape (CFT). In some embodiments, the first layer 18 is composed of a polyamide (PA) continuous fiber, unidirectional reinforced thermoplastic composite tape (CFT). In some embodiments, the "continuous fiber thermoplastic composite tape (CFT)" may be produced by one or more of the illustrated processes (the following are mere examples and are not meant to be limiting): i) fabrics woven by continuous reinforcement fibers are periodically stacked with thermoplastic films one by one and the stacked layers are pressed while heated in order to produce composite plates; ii) spreading continuous reinforcement fibers in a thermoplastic film or tape has been also investigated; and/or iii) continuous reinforcement fibers (CRF) can be commingled (e.g. air jetting) together with thermoplastic filaments.

In some embodiments, the composite tape (CFT) is composed of 40% to 80% glass fiber by weight. In some embodiments, the composite tape (CFT) is composed of 40% to 70% glass fiber by weight. In some embodiments, the composite tape (CFT) is composed of 40% to 60% glass fiber by weight. In some embodiments, the composite tape (CFT) is composed of 40% to 50% glass fiber by weight. In some embodiments, the composite tape (CFT) is composed of 50% to 80% glass fiber by weight. In some embodiments, the composite tape (CFT) is composed of 50% to 70% glass fiber by weight. In some embodiments, the composite tape (CFT) is composed of 50% to 60% glass fiber by weight. In some embodiments, the composite tape (CFT) is composed of 60% to 80% glass fiber by weight. In some embodiments, the composite tape (CFT) is composed of 60% to 70% glass fiber by weight. In some embodiments, the composite tape (CFT) is composed of 70% to 80% glass fiber by weight. In some embodiments, the composite tape (CFT) is composed of 40% glass fiber by weight. In some embodiments, the composite tape (CFT) is composed of 50% glass fiber by weight. In some embodiments, the composite tape (CFT) is composed of 60% glass fiber by weight. In some embodiments, the composite tape (CFT) is composed of 70% glass fiber by weight. In some embodiments, the composite tape (CFT) is composed of 80% glass fiber by weight.

In some embodiments, the composite tape (CFT) is composed of glass. In some embodiments, the composite tape (CFT) is composed of carbon fibers. In some embodiments, the composite tape (CFT) is composed of natural fibers. In some embodiments, the composite tape (CFT) is composed of structural fibers. In some embodiments, the first layer 18 is composed of a glass filled stiffening material. In some embodiments, the first layer 18 is composed of a glass filled polymer.

In some embodiments, the first layer 18 has a thickness of 4 mil to 15 mil. In some embodiments, the first layer 18 has a thickness of 4 mil to 14 mil. In some embodiments, the first layer 18 has a thickness of 4 mil to 13 mil. In some embodiments, the first layer 18 has a thickness of 4 mil to 12 mil. In some embodiments, the first layer 18 has a thickness of 4 mil to 11 mil. In some embodiments, the first layer 18 has a thickness of 4 mil to 10 mil. In some embodiments, the first layer 18 has a thickness of 4 mil to 9 mil. In some embodiments, the first layer 18 has a thickness of 4 mil to 8 mil. In some embodiments, the first layer 18 has a thickness of 4 mil to 7 mil. In some embodiments, the first layer 18 has a thickness of 4 mil to 6 mil. In some embodiments, the first layer 18 has a thickness of 4 mil to 5 mil. In some embodiments, the first layer 18 has a thickness of 5 mil to 15 mil. In some embodiments, the first layer 18 has a thickness of 5 mil to 14 mil. In some embodiments, the first layer 18 has a thickness of 5 mil to 13 mil. In some embodiments, the first layer 18 has a thickness of 5 mil to 12 mil. In some embodiments, the first layer 18 has a thickness of 5 mil to 11 mil. In some embodiments, the first layer 18 has a thickness of 5 mil to 10 mil. In some embodiments, the first layer 18 has a thickness of 5 mil to 9 mil. In some embodiments, the first layer 18 has a thickness of 5 mil to 8 mil. In some embodiments, the first layer 18 has a thickness of 5 mil to 7 mil. In some embodiments, the first layer 18 has a thickness of 5 mil to 6 mil.

In some embodiments, the first layer 18 has a thickness of 6 mil to 15 mil. In some embodiments, the first layer 18 has a thickness of 6 mil to 14 mil. In some embodiments, the first layer 18 has a thickness of 6 mil to 13 mil. In some embodiments, the first layer 18 has a thickness of 6 mil to 12 mil. In some embodiments, the first layer 18 has a thickness of 6 mil to 11 mil. In some embodiments, the first layer 18 has a thickness of 6 mil to 10 mil. In some embodiments, the first layer 18 has a thickness of 6 mil to 9 mil. In some embodiments, the first layer 18 has a thickness of 6 mil to 8 mil. In some embodiments, the first layer 18 has a thickness of 6 mil to 7 mil. In some embodiments, the first layer 18 has a thickness of 7 mil to 15 mil. In some embodiments, the first layer 18 has a thickness of 7 mil to 14 mil. In some embodiments, the first layer 18 has a thickness of 7 mil to 13 mil. In some embodiments, the first layer 18 has a thickness of 7 mil to 12 mil. In some embodiments, the first layer 18 has a thickness of 7 mil to 11 mil. In some embodiments, the first layer 18 has a thickness of 7 mil to 10 mil. In some embodiments, the first layer 18 has a thickness of 7 mil to 9 mil. In some embodiments, the first layer 18 has a thickness of 7 mil to 8 mil.

In some embodiments, the first layer 18 has a thickness of 8 mil to 15 mil. In some embodiments, the first layer 18 has a thickness of 8 mil to 14 mil. In some embodiments, the first layer 18 has a thickness of 8 mil to 13 mil. In some embodiments, the first layer 18 has a thickness of 8 mil to 12 mil. In some embodiments, the first layer 18 has a thickness of 8 mil to 11 mil. In some embodiments, the first layer 18 has a thickness of 8 mil to 10 mil. In some embodiments, the first layer 18 has a thickness of 8 mil to 9 mil. In some embodiments, the first layer 18 has a thickness of 9 mil to 15 mil. In some embodiments, the first layer 18 has a thickness of 9 mil to 14 mil. In some embodiments, the first layer 18 has a thickness of 9 mil to 13 mil. In some embodiments, the first layer 18 has a thickness of 9 mil to 12 mil. In some embodiments, the first layer 18 has a thickness of 9 mil to 11 mil. In some embodiments, the first layer 18 has a thickness of 9 mil to 10 mil. In some embodiments, the first layer 18 has a thickness of 10 mil to 15 mil. In some embodiments, the first layer 18 has a thickness of 10 mil to 14 mil. In some embodiments, the first layer 18 has a thickness of 10 mil to 13 mil. In some embodiments, the first layer 18 has a thickness of 10 mil to 12 mil. In some embodiments, the first layer 18 has a thickness of 10 mil to 11 mil.

In some embodiments, the first layer 18 has a thickness of 11 mil to 15 mil. In some embodiments, the first layer 18 has a thickness of 11 mil to 14 mil. In some embodiments, the first layer 18 has a thickness of 11 mil to 13 mil. In some embodiments, the first layer 18 has a thickness of 11 mil to 12 mil. In some embodiments, the first layer 18 has a thickness of 12 mil to 15 mil. In some embodiments, the first layer 18 has a thickness of 12 mil to 14 mil. In some embodiments, the first layer 18 has a thickness of 12 mil to 13 mil. In some embodiments, the first layer 18 has a thickness of 13 mil to 15 mil. In some embodiments, the first layer 18 has a thickness of 13 mil to 14 mil. In some embodiments, the first layer 18 has a thickness of 14 mil to 15 mil. In some embodiments, the first layer 18 has a thickness of 8 mil. In some embodiments, the first layer 18 has a thickness of 9 mil. In some embodiments, the first layer 18 has a thickness of 10 mil. In some embodiments, the first layer 18 has a thickness of 11 mil. In some embodiments, the first layer 18 has a thickness of 12 mil. In some embodiments, the first layer 18 has a thickness of 13 mil. In some embodiments, the first layer 18 has a thickness of 14 mil. In some embodiments, the first layer 18 has a thickness of 15 mil.

In some embodiments, the second layer 20 has a structure, size and composition similar to those of the first layer 18 as described above. In some embodiments, a thickness of the second layer 20 is equal to the thickness of the first layer 18. In some embodiments, a thickness of the second layer 20 is substantially similar to the thickness of the first layer 18. In some embodiments, a thickness of the second layer 20 is different than the thickness of the first layer 18.

In some embodiments, the third layer 22 is composed of a polymeric material. In some embodiments, the third layer 22 is a polymeric material composed of thermoplastic polyolefin (TPO). In some embodiments, the third layer 22 is a polymeric material composed of a single ply TPO roofing membrane. In other embodiments, non-limiting examples of TPO membranes are disclosed in U.S. Pat. No. 9,359,014 to Yang et al., which is incorporated by reference herein in its entirety. In some embodiments, the third layer 22 is a polymeric material composed of polyethylene ("PE"). In some embodiments, the third layer 22 is a polymeric material composed of polypropylene ("PP"). In some embodiments, the third layer 22 is a polymeric material composed of polyester (polyethylene terephthalate). In some embodiments, the third layer 22 is a polymeric material composed of polyethylene terephthalate ("PET"). In some embodiments, the third layer 22 is a polymeric material composed of ethylene tetrafluoroethylene ("ETFE"). In some embodiments, the third layer 22 is a polymeric material composed of an acrylic such as polymethyl methacrylate ("PMMA"). In some embodiments, the third layer 22 is a polymeric material composed of polyvinyl chloride (PVC). In some embodiments, the third layer 22 is a polymeric material composed of ethylene propylene diene ono er (EPDM) rubber. In some embodiments, the third layer 22 is a polymeric material composed of recycled rubber. In some embodiments, the third layer 22 is a polymeric material composed of modified bitumen. In some embodiments, the third layer 22 is a polymeric material composed of asphalt. In some embodiments, the third layer 22 is a polymeric material composed of a non-asphalt (NAS) roofing material. In some embodiments, the third layer 22 includes a flame retardant additive. In some embodiments, the flame retardant additive may be clays, nanoclays, silicas, carbon black, metal hydroxides such as aluminum hydroxide and aluminum trihydroxide (ATH), metal foils, graphite, and combinations thereof.

In some embodiments, the cap layer 12 includes a flame retardant additive and the core layer 14 includes a flame retardant additive. In some embodiments, the third layer 22 includes a flame retardant additive. In some embodiments, the cap layer 12 includes more flame retardant additive that that of the core layer 14. In some embodiments, the cap layer 12 is inherently flame retardant. In some embodiments, the core layer 14 is inherently flame retardant.

In some embodiments, the core layer 14 includes a thermal stabilizer. In some embodiments, the third layer 22 includes a thermal stabilizer. In some embodiments, the cap layer 12 includes an amount of a thermal stabilizer that is more than that of the core layer 14.

In some embodiments, the third layer 22 is composed of a water-resistant material. In some embodiments, the roofing shingle 10 is a watershedding layer when installed on a roof deck.

In some embodiments, the third layer 22 has a thickness of 20 mil to 100 mil. In some embodiments, the third layer 22 has a thickness of 20 mil to 90 mil. In some embodiments, the third layer 22 has a thickness of 20 mil to 80 mil. In some embodiments, the third layer 22 has a thickness of 20 mil to 70 mil. In some embodiments, the third layer 22 has a thickness of 20 mil to 60 mil. In some embodiments, the third layer 22 has a thickness of 20 mil to 50 mil. In some embodiments, the third layer 22 has a thickness of 20 mil to 40 mil. In some embodiments, the third layer 22 has a thickness of 20 mil to 30 mil. In some embodiments, the third layer 22 has a thickness of 30 mil to 100 mil. In some embodiments, the third layer 22 has a thickness of 30 mil to 90 mil. In some embodiments, the third layer 22 has a thickness of 30 mil to 80 mil. In some embodiments, the third layer 22 has a thickness of 30 mil to 70 mil. In some embodiments, the third layer 22 has a thickness of 30 mil to 60 mil. In some embodiments, the third layer 22 has a thickness of 30 mil to 50 mil. In some embodiments, the third layer 22 has a thickness of 30 mil to 40 mil. In some embodiments, the third layer 22 has a thickness of 40 mil to 100 mil. In some embodiments, the third layer 22 has a thickness of 40 mil to 90 mil. In some embodiments, the third layer 22 has a thickness of 40 mil to 80 mil. In some embodiments, the third layer 22 has a thickness of 40 mil to 70 mil. In some embodiments, the third layer 22 has a thickness of 40 mil to 60 mil. In some embodiments, the third layer 22 has a thickness of 40 mil to 50 mil. In some embodiments, the third layer 22 has a thickness of 50 mil to 100 mil. In some embodiments, the third layer 22 has a thickness of 50 mil to 90 mil. In some embodiments, the third layer 22 has a thickness of 50 mil to 80 mil. In some embodiments, the third layer 22 has a thickness of 50 mil to 70 mil. In some embodiments, the third layer 22 has a thickness of 50 mil to 60 mil. In some embodiments, the third layer 22 has a thickness of 60 mil to 100 mil. In some embodiments, the third layer 22 has a thickness of 60 mil to 90 mil. In some embodiments, the third layer 22 has a thickness of 60 mil to 80 mil. In some embodiments, the third layer 22 has a thickness of 60 mil to 70 mil. In some embodiments, the third layer 22 has a thickness of 70 mil to 100 mil. In some embodiments, the third layer 22 has a thickness of 70 mil to 90 mil. In some embodiments, the third layer 22 has a thickness of 70 mil to 80 mil. In some embodiments, the third layer 22 has a thickness of 80 mil to 100 mil. In some embodiments, the third layer 22 has a thickness of 80 mil to 90 mil. In some embodiments, the third layer 22 has a thickness of 90 mil to 100 mil.

In some embodiments, the third layer 22 has a thickness of 20 mil. In some embodiments, the third layer 22 has a thickness of 30 mil. In some embodiments, the third layer 22 has a thickness of 40 mil. In some embodiments, the third layer 22 has a thickness of 50 mil. In some embodiments, the third layer 22 has a thickness of 60 mil. In some embodiments, the third layer 22 has a thickness of 70 mil. In some embodiments, the third layer 22 has a thickness of 80 mil. In some embodiments, the third layer 22 has a thickness of 90 mil. In some embodiments, the third layer 22 has a thickness of 100 mil.

In some embodiments, the thickness of the third layer 22 is greater than a combined thickness of the first layer 18, the second layer 20, and the cap layer 12. In some embodiments, the roofing shingle 10 has a thickness of 35 mil to 200 mil. In some embodiments, the roofing shingle 10 has a thickness of 35 mil to 175 mil. In some embodiments, the roofing shingle 10 has a thickness of 35 mil to 150 mil. In some embodiments, the roofing shingle 10 has a thickness of 35 mil to 125 mil. In some embodiments, the roofing shingle 10 has a thickness of 35 mil to 100 mil. In some embodiments, the roofing shingle 10 has a thickness of 35 mil to 75 mil. In some embodiments, the roofing shingle 10 has a thickness of 35 mil to 50 mil. In some embodiments, the roofing shingle 10 has a thickness of 50 mil to 200 mil. In some embodiments, the roofing shingle 10 has a thickness of 50 mil to 175 mil. In some embodiments, the roofing shingle 10 has a thickness of 50 mil to 150 mil. In some embodiments, the roofing shingle 10 has a thickness of mil to 125 mil. In some embodiments, the roofing shingle 10 has a thickness of 50 mil to 100 mil. In some embodiments, the roofing shingle 10 has a thickness of 50 mil to 75 mil. In some embodiments, the roofing shingle 10 has a thickness of 75 mil to 200 mil. In some embodiments, the roofing shingle 10 has a thickness of 75 mil to 175 mil. In some embodiments, the roofing shingle 10 has a thickness of 75 mil to 150 mil. In some embodiments, the roofing shingle 10 has a thickness of 75 mil to 125 mil. In some embodiments, the roofing shingle 10 has a thickness of mil to 100 mil. In some embodiments, the roofing shingle 10 has a thickness of 100 mil to 200 mil. In some embodiments, the roofing shingle 10 has a thickness of 100 mil to 175 mil. In some embodiments, the roofing shingle 10 has a thickness of 100 mil to 150 mil. In some embodiments, the roofing shingle 10 has a thickness of 100 mil to 125 mil. In some embodiments, the roofing shingle 10 has a thickness of 125 mil to 200 mil. In some embodiments, the roofing shingle 10 has a thickness of 125 mil to 175 mil. In some embodiments, the roofing shingle 10 has a thickness of 125 mil to 150 mil. In some embodiments, the roofing shingle 10 has a thickness of 150 mil to 200 mil. In some embodiments, the roofing shingle 10 has a thickness of 150 mil to 175 mil. In some embodiments, the roofing shingle 10 has a thickness of 175 mil to 200 mil. In some embodiments, the roofing shingle 10 has a thickness of 35 mil. In some embodiments, the roofing shingle 10 has a thickness of 50 mil. In some embodiments, the roofing shingle 10 has a thickness of 75 mil. In some embodiments, the roofing shingle 10 has a thickness of 100 mil. In some embodiments, the roofing shingle 10 has a thickness of 125 mil. In some embodiments, the roofing shingle 10 has a thickness of 150 mil. In some embodiments, the roofing shingle 10 has a thickness of 175 mil. In some embodiments, the roofing shingle 10 has a thickness of 200 mil.

In some embodiments, the fibers F of the composite tape (CFT) of the first layer 18 extend in a first direction. In some embodiments, the fibers F of the composite tape (CFT) of the second layer 20 extend in the first direction. In some embodiments, the first direction extends along a longitudinal axis A-A of the roofing shingle in a "0 direction," (i.e., along the length L), as shown in FIG. 3. In some embodiments, the configuration of the fibers of the composite tape (CFT) of the first layer 18 and the fibers of the composite tape (CFT) of the second layer 20 reduce buckling of the roofing shingle 10 in the 0 direction stiffens the roofing shingle 10 and reduces bending thereof from manual handling by a user.

In some embodiments, the roofing shingle 10 includes a flexural modulus that is higher than a flexural modulus of a roofing shingle in which the core layer 14 includes only the third layer 22 and does not include the first layer 18 and the second layer 20. In some embodiments, the roofing shingle 10 includes a coefficient of thermal expansion (CTE) that is lower than a coefficient of thermal expansion (CTE) of a roofing shingle in which the core layer 14 includes only the third layer 22 and does not include the first layer 18 and the second layer 20. In some embodiments, the composite tape (CFT) of the first layer 18 and the composite tape (CFT) of the second layer 20 is configured to adjust the flexural rigidity of the roofing shingle 10 is specific directions, tensile stiffness in specific directions, the coefficient of thermal expansion (CTE) in specific directions, and the time/stress/temperature properties of creep and shrinkage.

In some embodiments, the configuration of the fibers of the composite tape (CFT) of the first layer 18 extending in the first direction (0 direction) and the fibers of the composite tape (CFT) of the second layer 20 extending in the first direction (0 direction) reduce buckling of the roofing shingle 10. As used herein, the term "buckling" means to bend or a change in shape (deformation) under a load or force, and, with respect to the roofing shingle 10, a change in shape or mechanical stability under a load or force, including under thermal expansion loads.

In some embodiments, buckling of the roofing shingle 10 is reduced by reduction of the coefficient of thermal expansion (CTE) difference to reduce the thermal expansion load, resulting in the roofing shingle 10 less likely to reach a critical stress to buckling ($\sigma_{cr}$) as calculated in the below formula:

$$\sigma_{cr} = \frac{P_{cr}}{A} = S_y - \left(\frac{S_y}{2\pi}\frac{KL}{r}\right)^2\left(\frac{1}{E}\right)$$

In some embodiments, buckling of the roofing shingle 10 is reduced by decreasing the thickness of the third layer 22, but maintaining the radius of gyration ("r", which is proportional to the flexural stiffness) will increase $\sigma_{cr}$ and reduce buckling. In some embodiments, buckling of the roofing shingle 10 is reduced by increasing the radius of gyration (r).

In some embodiments, each of the first layer 18 and the second layer 20 has a coefficient of thermal expansion (CTE) of 5µ to 15µ and a modulus of 5 GPa to 20 GPa. In some embodiments, the third layer 22 has a coefficient of thermal expansion (CTE) of 300µ to 400µ. In some embodiments, the effective coefficient of thermal expansion (CTE) of the roofing shingle is 15µ to 30µ.

In some embodiments, the effective radius of gyration (r) is increased by using a composite material in the core layer 14. In some embodiments, the radius of gyration for the roofing shingle is calculated as:

$$r = \sqrt{\frac{I}{A}}$$

where the area moment of inertia, I, is expressed as an equivalent based upon the composite materials. In some embodiments, $E_{composite}$ is the flexural modulus of the composite, and $I_{composite}$ can be calculated by assuming the rigidity of the two laminates is equivalent:

$$I_{composite} = \frac{E_{polymer}}{E_{composite}} I_{polymer}$$

In some embodiments, increasing the modulus of the composite by adding the CFT tape increases the radius of gyration (r), which reduces buckling.

Figure 4:
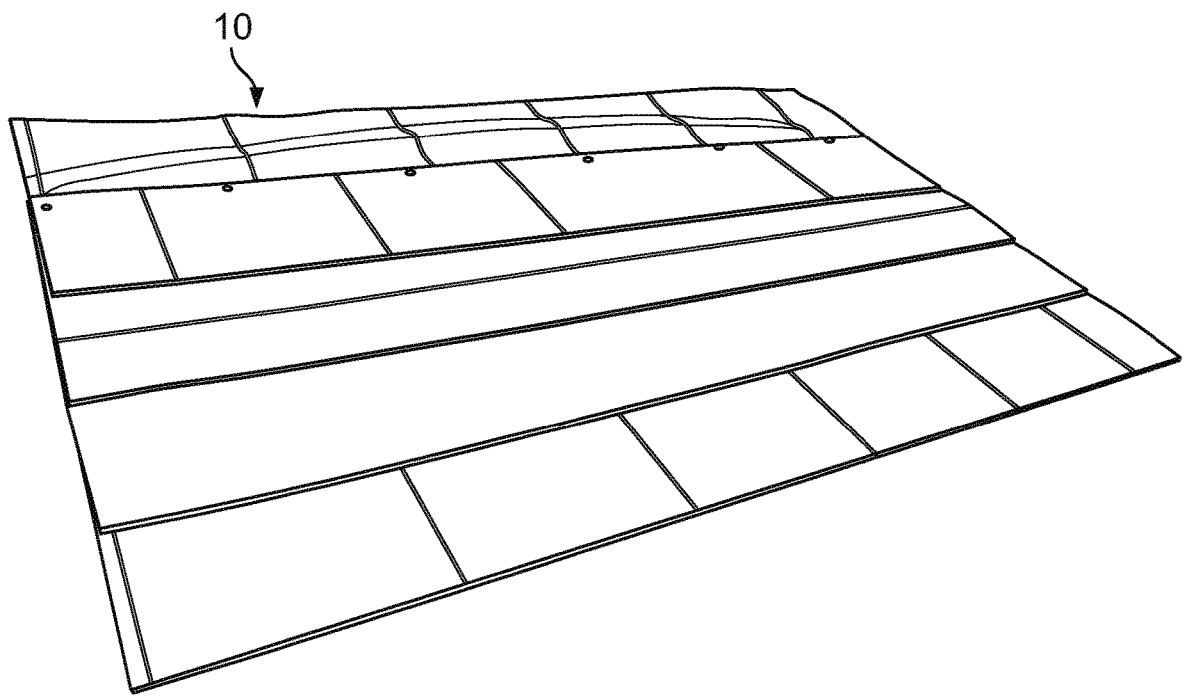
FIGS. 4 and 5 illustrate some embodiments of a roofing shingle.
Figure 5:
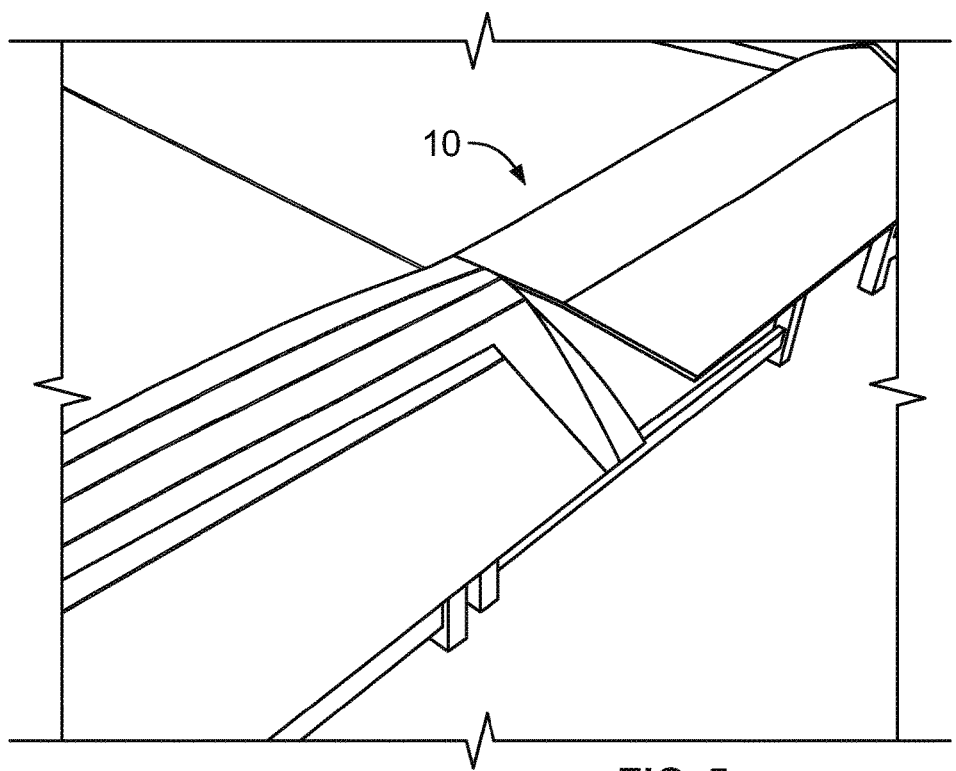

Referring to FIGS. 4 and 5, as a non-limiting example of some embodiments, the roofing shingle 10 is brought to a temperature of 0° C. and heating up the roofing shingle 10 to above 60° C., a result of which no significant buckling occurs.

In some embodiments, the CFT tape of the first layer 18 and the second layer 20 reduces wind uplift. In some embodiments, the roofing shingle 10 has a wind resistance that conforms to standards under ASTM D3462 test standards. In some embodiments, the roofing shingle 10 includes a Class A rating when tested in accordance with ASTM D3462.

In another embodiment, the core layer 14 is a colored layer. In another embodiment, the core layer 14 includes a black color. In some embodiments, the color of the core layer 14 includes a mixture of colors. In some embodiments, the core layer 14 includes an infrared reflective pigment. In some embodiments, the cap layer 12 includes a colorant or pigment and the core layer 14 includes a colorant or pigment. In some embodiments, the cap layer 12 includes more colorant or pigment that that of the core layer 14. In some embodiments, the core layer 14 does not include any colorant or pigment.

In some embodiments, the roofing shingle 10 is configured to be a component of a photovoltaic system that includes a fire resistance that conforms to standards under UL 790/ASTM E 108 test standards. In some embodiments, the roofing shingle 10 includes a Class A rating when tested in accordance with UL 790/ASTM E 108.

In some embodiments, the roofing shingle 10 is cuttable. In some embodiments, the roofing shingle 10 is cuttable to a desired size and shape. As used herein, the term "cuttable" means capable of being cut or penetrated with or as if with by an edged instrument, and with respect to certain embodiments of the roofing shingle 10, the roofing shingle 10 is capable of being cut or penetrated by an edged instrument such as a cutting knife, scissors, razor, or other suitable roofing shingle cutting instruments and tools. In some embodiments, the roofing shingle 10 is configured to be installed on the roof deck. In some embodiments, the roofing shingle 10 is configured to be installed on non-solar roof planes of the roof deck. In some embodiments, the roof deck is steep slope roof deck. As defined herein, a "steep slope roof deck" is any roof deck that is disposed on a roof having a pitch of Y/X, where Y and X are in a ratio of 4:12 to 12:12, where Y corresponds to the "rise" of the roof, and where X corresponds to the "run" of the roof. In some embodiments, the roofing shingle 10 is configured to be installed either partially or fully around an array of photovoltaic modules. In some embodiments, the roofing shingle 10 is cuttable to a size and shape for positioning around obstacles, such as vents, chimneys, antennas, and other roofing structures. In some embodiments, the roofing shingle 10 cuttable to a size and shape to extend to roofing eaves and ridges.

In some embodiments, the cap layer 12 and the core layer 14 are laminated. In some embodiments, the cap layer 12 and the first layer 18, the second layer 20, and the third layer 22 of the core layer 14 are laminated simultaneously. In some embodiments, the first layer 18, the second layer 20, and the third layer 22 of the core layer 14 are first laminated with one another, and subsequently the core layer 14, including the laminated ones of the first layer 18, the second layer 20, and the third layer 22, is laminated with the cap layer 12.

In some embodiments, the cap layer 12 is extruded. In some embodiments, the first layer 18 is extruded. In some embodiments, the second layer 20 is extruded. In some embodiments, the third layer 22 is extruded. In some embodiments, the cap layer 12 is extruded separately from the first layer 18. In some embodiments, the cap layer 12 is extruded separately from the second layer 20. In some embodiments, the cap layer 12 is extruded separately from the third layer 22. In some embodiments, the third layer 22 is extruded separately from the first layer 18. In some embodiments, the third layer 22 is extruded separately from the second layer 20. In some embodiment, any combination of the layers are extruded together.

In some embodiments, the cap layer 12 does not include a scrim. In some embodiments, the core layer 14 does not include a scrim.

In some embodiments, the roofing shingle 10 includes a headlap portion 24. In some embodiments, the headlap portion 24 extends from a first end 26 of the roofing shingle 10 to a second end 28 opposite the first end 26. In some embodiments, at least a portion of a reveal portion of one of the roofing shingles 10 overlays at least a portion of the headlap portion 24 of another of the roofing shingles 10. In some embodiments, the roofing shingle 10 includes at least one side lap 32. In some embodiments, the at least one side lap 32 is located at the first end 26. In some embodiments, the at least one side lap 32 is located at the second end 28. In some embodiments, the at least one side lap 32 includes a first side lap 32 located at the first end 26 and a second side lap 32 located at the second end 28. In some embodiments, the at least one side lap 32 of one of the roofing shingles 10 overlays the at least one side lap 32 of another of the roofing shingles 10. In some embodiments, the roofing shingle 10 is a watershedding layer when installed on a roof deck.

In some embodiments, the roofing shingle 10 includes a backsheet 34. In some embodiments, the backsheet 34 is juxtaposed with the core layer 14. In some embodiments, the backsheet 34 is juxtaposed with the second layer 20. In some embodiments, the backsheet 34 is juxtaposed with the lower most layer of the core layer 14. In some embodiments, the cap layer 12 and the core layer 14 are laminated with the backsheet 34 simultaneously. In some embodiments, the cap layer 12 and the core layer 14 are laminated to one another, and then are laminated to the backsheet 34. In some embodiments, the headlap portion 24 and the at least one side lap 32 are formed by the backsheet 34. In some embodiments, the roofing shingle 10 does not include headlap portion 24 and the at least one side lap 32. In some embodiments, the roofing shingle 10 does not include the at least one side lap 32. In some embodiments, the roofing shingle 10 does not include the headlap portion 24. In some embodiments, the backsheet 34 includes a structure and composition similar to those of the third layer 22, as described above.

In some embodiments, the roofing shingle 10 does not include the backsheet 34. In some embodiments, the headlap portion 24 and the at least one side lap 32 are formed by the third layer 22. In some embodiments, a length of the third layer 22 is greater than a length of the first layer 18. In some embodiments, a length of the third layer 22 is greater than a length of the second layer 20. In some embodiments, a length of the third layer 22 is greater than a length of the cap layer 12. In some embodiments, a width of the third layer 22 is greater than a width of the first layer 18. In some embodiments, a width of the third layer 22 is greater than a width of the second layer 20. In some embodiments, a width of the third layer 22 is greater than a width of the cap layer 12.

Figure 6:
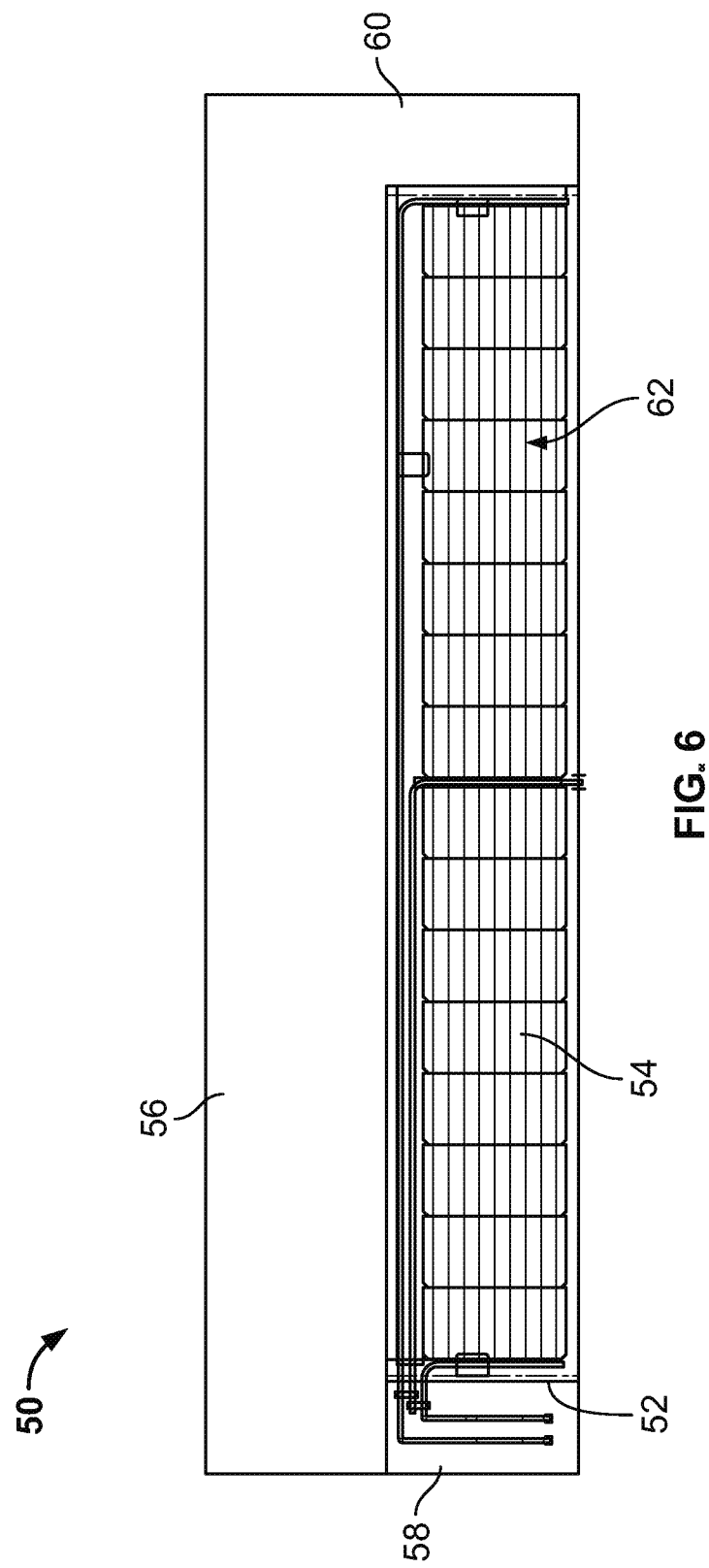
FIG. 6 is a top plan view of some embodiments of a photovoltaic module.

Referring to FIG. 6, in some embodiments, a photovoltaic module 50 includes an active area 52 having a plurality of solar cells 54. In some embodiments, the photovoltaic module 50 includes an inactive area comprising a headlap portion 56, a first side lap 58 located at one end of the photovoltaic module 50, and a second side lap 60 located at an opposite end of the photovoltaic module 50. In some embodiments, the photovoltaic module 50 includes a structure and function similar to the photovoltaic modules disclosed in International Publication No. WO 2022/051593 to GAF Energy, LLC, International Application No. PT/US2021/049017, filed Sep. 3, 2021, entitled "BUILDING INTEGRATED PHOTOVOLTAIC SYSTEM," the contents of which are incorporated by reference herein in its entirety.

In some embodiments, at least a portion of a reveal portion 62 of one of the photovoltaic modules 50 overlays at least a portion of the headlap portion 24 of one of the roofing shingles 10. In some embodiments, the first side lap 58 of one of the photovoltaic modules 50 overlays one of the at least one side lap 32 of one of the roofing shingles 10. In some embodiments, the second side lap 60 of one of the photovoltaic modules 50 overlays another one of the at least one side lap 32 of one of the roofing shingles 10. In some embodiments, the watershedding of the roofing shingle 10 is substantially similar to the watershedding of the photovoltaic module 50.

Figure 7:
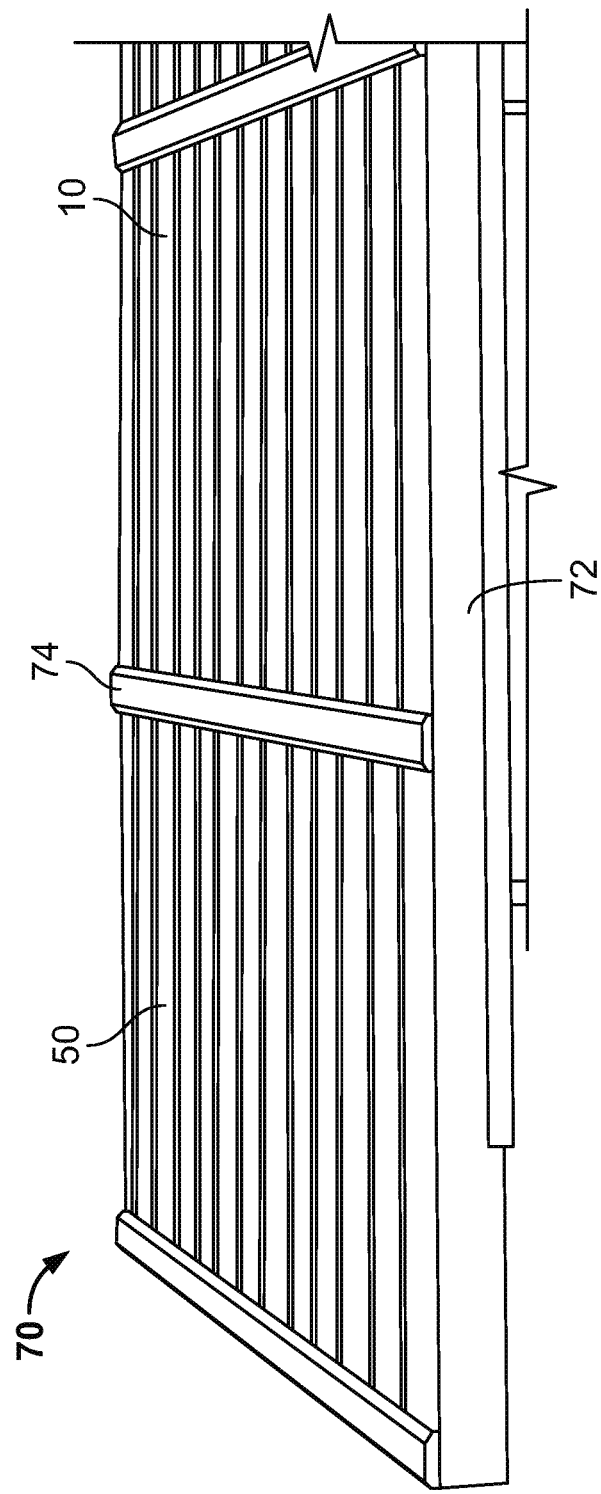
FIG. 7 is illustrates some embodiments of a roofing system employing a plurality of the photovoltaic module shown in FIG. 6 and the roofing shingle shown in FIGS. 1 through 5.

Referring to FIG. 7, in some embodiments, a system 70 includes a plurality of the photovoltaic modules 50 and a plurality of the roofing shingles 10 installed in a roof deck 72. In some embodiments, the plurality of the photovoltaic modules 50 and the plurality of the roofing shingles 10 are arranged in an array. In some embodiments, the system 70 includes at least one wireway 74 installed proximate to the first end 26 of the roofing shingle 10. In some embodiments, the at least one wireway 74 is installed proximate to the second end 28 of the roofing shingle 10. In some embodiments, the at least one wireway 74 is installed intermediate the first end 26 of one of the roofing shingles 10 and a second end 28 of another one of the roofing shingles 10. In some embodiments, the at least one wireway 74 includes a lid. In some embodiments, the lid is removably attached to the at least one wireway 74. In some embodiments, the at least one wireway 74 includes a plurality of the wireways 74. In some embodiments, one of the lids of one of the plurality of wireways 74 overlaps another of the lids of another of the plurality of wireways 74. In some embodiments, the at least one wireway 74 overlays a corresponding one of the first side laps 58. In some embodiments, the at least one wireway 74 includes a height of 1 mm to 20 mm. In some embodiments, the at least one wireway 74 includes a single wireway installed proximate to the first end of each of the roofing shingles 10. In some embodiments, the at least one wireway 74 does not include any electrical components or electrical wires or cables therein.

In some embodiments, a method includes the steps of:
obtaining a plurality of the roofing shingles 10.
obtaining a plurality of the photovoltaic modules 50;
installing the plurality of photovoltaic modules 50 on the roof deck;
cutting at least one of the plurality of roofing shingles 10 to a size and shape; and
installing the plurality of roofing shingles 10 on the roof deck proximate to the plurality of photovoltaic modules 50.

In some embodiments, the plurality of roofing shingles 10 and the plurality of photovoltaic modules 50 are installed on the roof deck a single roof face. In another embodiment, the plurality of roofing shingles 10 and the plurality of photovoltaic modules 50 are installed on the roof deck in multiple roof faces. In another embodiment, the plurality of roofing shingles 10 and the plurality of photovoltaic modules 50 are installed on all faces of the roof deck. In some embodiments, the system includes a second plurality of roofing shingles. In some embodiments, the second plurality of roofing shingles includes asphalt shingles. In some embodiments, the plurality of roofing shingles 10 are at least 5, 10, 15, 20, 25 or more shingles.

Figure 8:
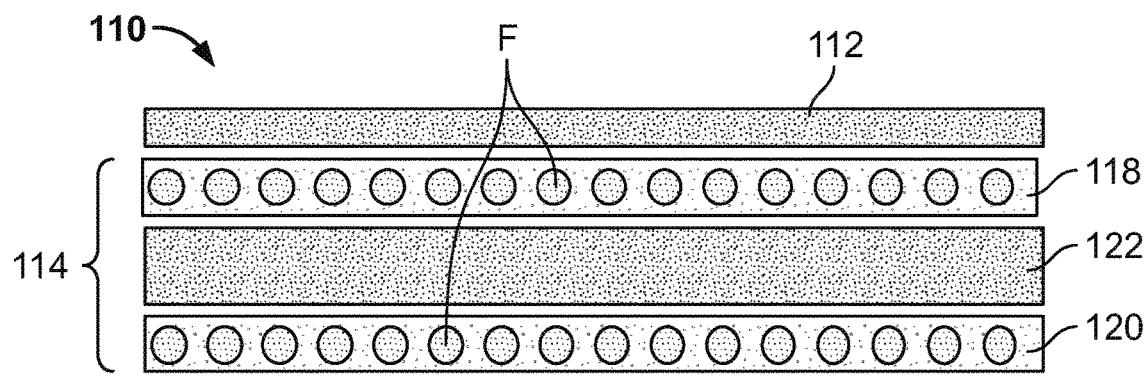
FIGS. 8 through 10 show some embodiments of a roofing shingle.
Figure 9:
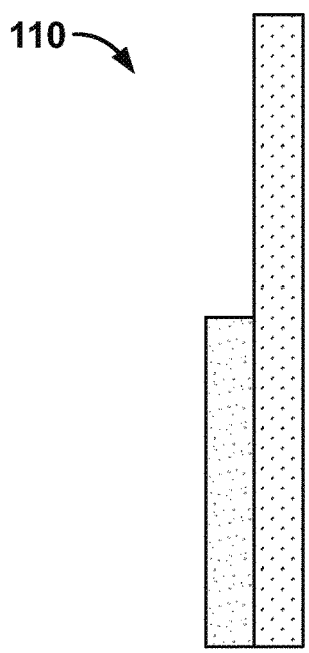
Figure 10:
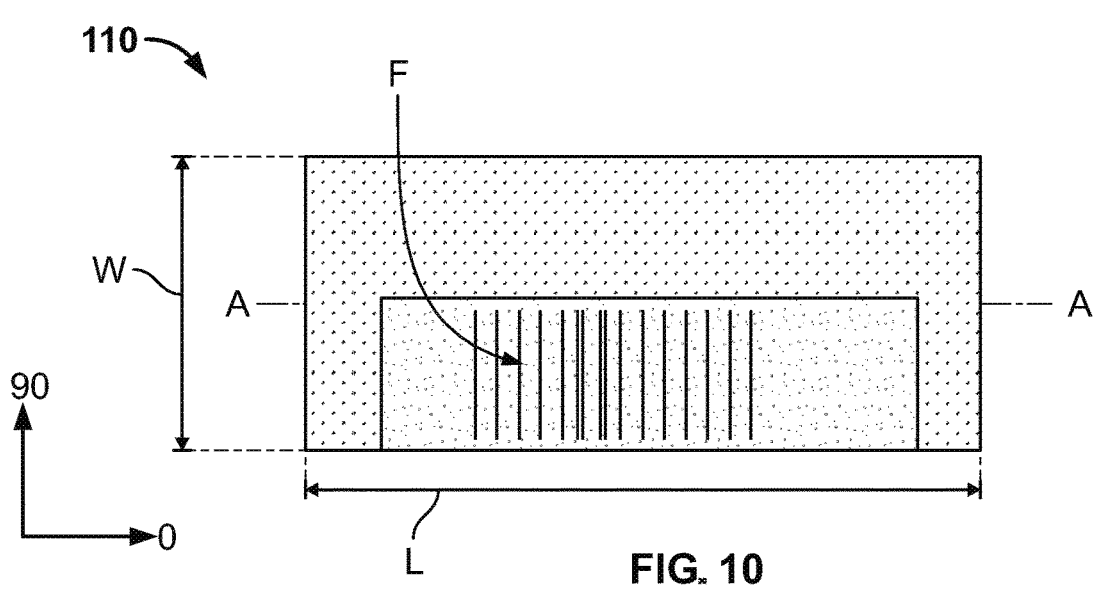

FIGS. 8 through 10 show some embodiments of a roofing shingle 110. The roofing shingle 10 is similar in structure and function to those of the roofing shingle 10 except as noted below. In some embodiments, the roofing shingle 110 includes a cap layer 112 and a core layer 114. In some embodiments, the core layer 114 includes a first layer 118, a second layer 120 and a third layer 122 between the first layer 118 and the second layer 120. In some embodiments, the fibers F of the composite tape (CFT) of a first layer 118 extend in a second direction. In some embodiments, the fibers F of the composite tape (CFT) of the second layer 120 extend in the second direction. In some embodiments, the second direction extends transverse of the longitudinal axis A-A of the roofing shingle 110 in a "90 direction," (i.e., along the length W), as shown in FIG. 10. In some embodiments, the configuration of the fibers of the composite tape (CFT) of the first layer 118 extending in the second direction and the fibers of the composite tape (CFT) of the second layer 120 extending in the second direction stiffens the roofing shingle 110 and reduces bending thereof from step loads.

In some embodiments, the fibers F of the composite tape (CFT) of the first layer 118 extend in a third direction that is between the longitudinal axis A-A of the roofing shingle 110 (0 direction) and the transverse direction (90 direction). In some embodiments, the third direction extends 45 degrees (45 direction) between the longitudinal axis A-A of the roofing shingle 110 (0 direction) and the transverse direction (90 direction). In some embodiments, the third direction extends 1 degree to 89 degrees between the longitudinal axis A-A of the roofing shingle 110 (0 direction) and the transverse direction (90 direction).

In some embodiments, the fibers F of the composite tape (CFT) of the second layer 120 extend in a third direction that is between the longitudinal axis A-A of the roofing shingle 110 (0 direction) and the transverse direction (90 direction). In some embodiments, the third direction extends 45 degrees (45 direction) between the longitudinal axis A-A of the roofing shingle 110 (0 direction) and the transverse direction (90 direction). In some embodiments, the third direction extends 1 degree to 89 degrees between the longitudinal axis A-A of the roofing shingle 110 (0 direction) and the transverse direction (90 direction).

In some embodiments, the fibers of the composite tape (CFT) of the first layer 118 includes a mesh cross-section. In some embodiments, a first plurality of the fibers of the composite tape (CFT) of the first layer 118 extends in the first direction (0 direction) and a second plurality of the fibers extend in the second direction (90 direction). In some embodiments, the fibers of the composite tape (CFT) of the second layer 120 includes a mesh cross-section. In some embodiments, a first plurality of the fibers of the composite tape (CFT) of the second layer 120 extends in the first direction (0 direction) and a second plurality of the fibers extend in the second direction (90 direction).

Figure 11:
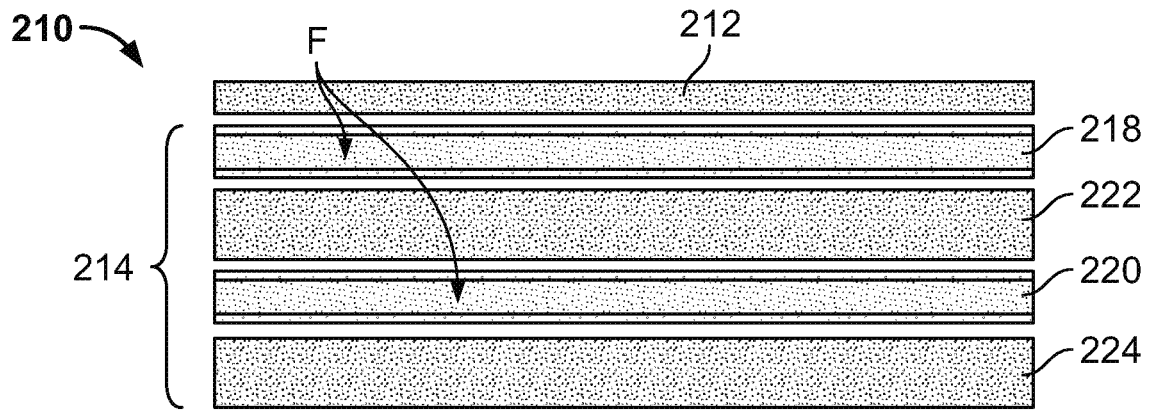

FIG. 11 shows some embodiments of a roofing shingle 210. The roofing shingle 210 is similar in structure and function to those of the roofing shingle 10 except as noted below. In some embodiments, the roofing shingle 210 includes a cap layer 212 and a core layer 214. In some embodiments, the core layer 214 includes a first layer 218, a second layer 220, a third layer 222 between the first layer 218 and the second layer 220, and a fourth layer 224 juxtaposed with the second layer 220. In some embodiments, the cap layer 212 includes a structure and function similar to those of the cap layer 12 of the roofing shingle 10, as described above. In some embodiments, each of the first layer 218, the second layer 220, and the third layer 222 has a structure and function similar to those of the first layer 18, the second layer 20, and the third layer 22 of the roofing shingle 10, respectively, as described above. In some embodiments, the fourth layer 224 is the lower most layer of the roofing shingle 210. In some embodiments, the fourth layer 224 includes a structure and function similar to those of the third layer 222. In some embodiments, the fibers of the composite tape (CFT) of the first layer 218 extends in the first direction (0 direction) and the fibers of the composite tape (CFT) of the second layer 220 extends in the first direction (0 direction).

Figure 12:
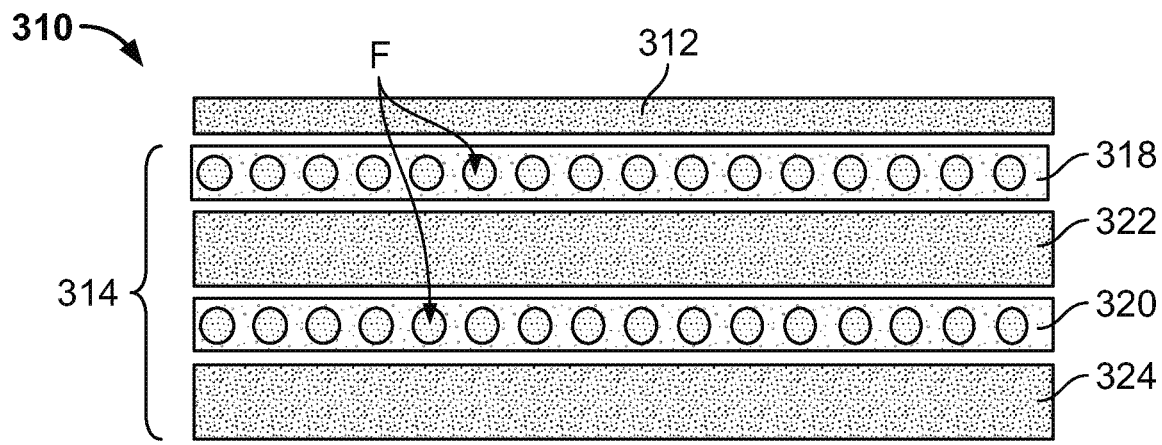

FIG. 12 shows some embodiments of a roofing shingle 310. The roofing shingle 310 is similar in structure and function to those of the roofing shingle 110 except as noted below. In some embodiments, the roofing shingle 310 includes a cap layer 312 and a core layer 314. In some embodiments, the core layer 314 includes a first layer 318, a second layer 320, a third layer 322 between the first layer 318 and the second layer 320, and a fourth layer 324 juxtaposed with the second layer 320. In some embodiments, the cap layer 312 includes a structure and function similar to those of the cap layer 112 of the roofing shingle 110, as described above. In some embodiments, each of the first layer 318, the second layer 320, and the third layer 322 has a structure and function similar to those of the first layer 118, the second layer 120, and the third layer 122 of the roofing shingle 110, respectively, as described above. In some embodiments, the fourth layer 324 is the lower most layer of the roofing shingle 310. In some embodiments, the fourth layer 324 includes a structure and function similar to those of the third layer 322. In some embodiments, the fibers of the composite tape (CFT) of the first layer 318 extends in the second direction (90 direction) and the fibers of the composite tape (CFT) of the second layer 320 extends in the second direction (90 direction).

In some embodiments, the fibers F of the composite tape (CFT) of the first layer 318 extend in a third direction that is between the longitudinal axis A-A of the roofing shingle 310 (0 direction) and the transverse direction (90 direction). In some embodiments, the third direction extends 45 degrees (45 direction) between the longitudinal axis A-A of the roofing shingle 310 (0 direction) and the transverse direction (90 direction). In some embodiments, the third direction extends 0.1 degree to 89.9 degrees between the longitudinal axis A-A of the roofing shingle 310 (0 direction) and the transverse direction (90 direction).

In some embodiments, the fibers F of the composite tape (CFT) of the second layer 320 extend in a third direction that is between the longitudinal axis A-A of the roofing shingle 310 (0 direction) and the transverse direction (90 direction). In some embodiments, the third direction extends 45 degrees (45 direction) between the longitudinal axis A-A of the roofing shingle 310 (0 direction) and the transverse direction (90 direction). In some embodiments, the third direction extends 1 degree to 89 degrees between the longitudinal axis A-A of the roofing shingle 310 (0 direction) and the transverse direction (90 direction).

In some embodiments, the fibers of the composite tape (CFT) of the first layer 318 includes a mesh cross-section. In some embodiments, a first plurality of the fibers of the composite tape (CFT) of the first layer 318 extends in the first direction (0 direction) and a second plurality of the fibers extend in the second direction (90 direction). In some embodiments, the fibers of the composite tape (CFT) of the second layer 320 includes a mesh cross-section. In some embodiments, a first plurality of the fibers of the composite tape (CFT) of the second layer 320 extends in the first direction (0 direction) and a second plurality of the fibers extend in the second direction (90 direction).

Figure 13:
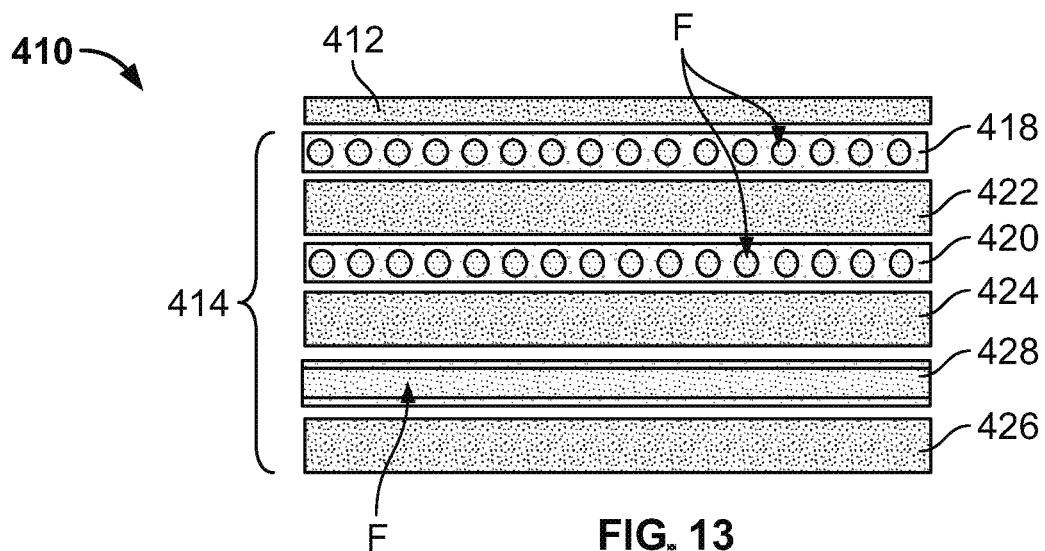

FIG. 13 shows some embodiments of a roofing shingle 410. The roofing shingle 410 is similar in structure and function to those of the roofing shingle 310 except as noted below. In some embodiments, the roofing shingle 410 includes a cap layer 412 and a core layer 414. In some embodiments, the core layer 414 includes a first layer 418, a second layer 420, a third layer 422 between the first layer 418 and the second layer 420, a fourth layer 424 juxtaposed with the second layer 420, a fifth layer 426, and a sixth layer 428 between the fourth layer 424 and the fifth layer 426. In some embodiments, the fifth layer 426 is the lower most layer of the roofing shingle 410. In some embodiments, the cap layer 412 includes a structure and function similar to those of the cap layer 312 of the roofing shingle 310, as described above. In some embodiments, each of the first layer 418, the second layer 420, the third layer 422 and the fourth layer 424 has a structure and function similar to those of the first layer 318, the second layer 320, the third layer 322, and the fourth layer 324 of the roofing shingle 310, respectively, as described above. In some embodiments, the fifth layer 426 includes a structure and function similar to those of the third layer 422. In some embodiments, the fibers of the composite tape (CFT) of the first layer 418 extends in the second direction (90 direction) and the fibers of the composite tape (CFT) of the second layer 420 extends in the second direction (90 direction). In some embodiments, the fibers of the composite tape (CFT) of the sixth layer 428 extends in the first direction (0 direction).

In some embodiments, the fibers of the composite tape (CFT) of the first layer 418 extends in the first direction (0 direction), the fibers of the composite tape (CFT) of the second layer 420 extends in the first direction (0 direction), and the fibers of the composite tape (CFT) of the sixth layer 428 extends in the first direction (0 direction).

In some embodiments, the fibers of the composite tape (CFT) of the first layer 418 extends in the first direction (0 direction), the fibers of the composite tape (CFT) of the second layer 420 extends in the first direction (0 direction), and the fibers of the composite tape (CFT) of the sixth layer 428 extends in the second direction (90 direction).

In some embodiments, the fibers of the composite tape (CFT) of the first layer 418 extends in the first direction (0 direction), the fibers of the composite tape (CFT) of the second layer 420 extends in the second direction (90 direction), and the fibers of the composite tape (CFT) of the sixth layer 428 extends in the first direction (0 direction).

In some embodiments, the fibers of the composite tape (CFT) of the first layer 418 extends in the second direction (90 direction), the fibers of the composite tape (CFT) of the second layer 420 extends in the first direction (0 direction), and the fibers of the composite tape (CFT) of the sixth layer 428 extends in the first direction (0 direction).

In some embodiments, the fibers of the composite tape (CFT) of the first layer 418 extends in the first direction (0 direction), the fibers of the composite tape (CFT) of the second layer 420 extends in the second direction (90 direction), and the fibers of the composite tape (CFT) of the sixth layer 428 extends in the second direction (90 direction).

In some embodiments, the fibers of the composite tape (CFT) of the first layer 418 extends in the second direction (90 direction), the fibers of the composite tape (CFT) of the second layer 420 extends in the first direction (0 direction), and the fibers of the composite tape (CFT) of the sixth layer 428 extends in the second direction (90 direction).

In some embodiments, the fibers of the composite tape (CFT) of the first layer 418 extends in the second direction (90 direction), the fibers of the composite tape (CFT) of the second layer 420 extends in the second direction (90 direction), and the fibers of the composite tape (CFT) of the sixth layer 428 extends in the second direction (90 direction).

In some embodiments, the fibers of the composite tape (CFT) of the first layer 418 extends in a third direction between the first direction (0 direction) and the second direction (90 direction). In some embodiments, the fibers of the composite tape (CFT) of the first layer 418 extends 45 degrees. In some embodiments, the fibers of the composite tape (CFT) of the first layer 418 extends 1 degree to 89 degrees.

In some embodiments, the fibers of the composite tape (CFT) of the second layer 420 extends in a third direction between the first direction (0 direction) and the second direction (90 direction). In some embodiments, the fibers of the composite tape (CFT) of the second layer 420 extends 45 degrees. In some embodiments, the fibers of the composite tape (CFT) of the second layer 420 extends 1 degree to 89 degrees.

In some embodiments, the fibers of the composite tape (CFT) of the sixth layer 428 extends in a third direction between the first direction (0 direction) and the second direction (90 direction). In some embodiments, the fibers of the composite tape (CFT) of the sixth layer 428 extends 45 degrees. In some embodiments, the fibers of the composite tape (CFT) of the sixth layer 428 extends 1 degree to 89 degrees.

In some embodiments, the fibers of the composite tape (CFT) of the first layer 418 includes a mesh cross-section. In some embodiments, the fibers of the composite tape (CFT) of the second layer 420 includes a mesh cross-section. In some embodiments, the fibers of the composite tape (CFT) of sixth layer 428 includes a mesh cross-section.

In some embodiments, the roofing shingle 410 does not include the first layer 418 and the third layer 422. In some embodiments, the roofing shingle 410 does not include the second layer 420 and the fourth layer 424.

In some embodiments, the fibers of the composite tape (CFT) of at least one layer of the roofing shingles 10, 110, 210, 310, 410 extends in the first direction (0 direction). In some embodiments, the fibers of the composite tape (CFT) of at least one layer of the roofing shingles 110, 210, 310, 410 extends in the second direction (90 direction). In some embodiments, the fibers of the composite tape (CFT) of at least one layer of the roofing shingles 10, 110, 210, 310, 410 extends in the 45 direction. In some embodiments, the fibers of the composite tape (CFT) of at least one layer of the roofing shingles 10, 110, 210, 310, 410 extends 1 degree to 89 degrees. In some embodiments, the fibers of the composite tape (CFT) of at least two layers of the roofing shingles 10, 110, 210, 310, 410 extend in the first direction (0 direction). In some embodiments, the fibers of the composite tape (CFT) of at least two layers of the roofing shingles 10, 110, 210, 310, 410 extend in the second direction (90 direction). In some embodiments, the fibers of the composite tape (CFT) of at least two layers of the roofing shingles 10, 110, 210, 310, 410 extend in the 45 direction. In some embodiments, the fibers of the composite tape (CFT) of at least two layers of the roofing shingles 10, 110, 210, 310, 410 extends 1 degree to 89 degrees. In some embodiments, the fibers of the composite tape (CFT) of at least one layer of the roofing shingles 110, 210, 310, 410 extend in the first direction (0 direction), and the fibers of the composite tape (CFT) of at least one of another layer extend in the second direction (90 direction).

In some embodiments, the fibers of the composite tape (CFT) of at least one layer of the roofing shingles 10, 110, 210, 310, 410 extend in the first direction (0 direction), and the fibers of the composite tape (CFT) of at least one of another layer extend in the 45 direction. In some embodiments, the fibers of the composite tape (CFT) of at least one layer of the roofing shingles 110, 210, 310, 410 extend in the first direction (0 direction), and the fibers of the composite tape (CFT) of at least one of another layer extend 1 degree to 89 degrees.

In some embodiments, the fibers of the composite tape (CFT) of at least one layer of the roofing shingles 10, 110, 210, 310, 410 extend in the second direction (90 direction), and the fibers of the composite tape (CFT) of at least one of another layer extend in the 45 direction. In some embodiments, the fibers of the composite tape (CFT) of at least one layer of the roofing shingles 110, 210, 310, 410 extend in the second direction (90 direction), and the fibers of the composite tape (CFT) of at least one of another layer extend 1 degree to 89 degrees.

In some embodiments, the fibers of the composite tape (CFT) of at least two layers of the roofing shingles 10, 110, 210, 310, 410 extend in the first direction (0 direction), and the fibers of the composite tape (CFT) of at least two other layers extend in the second direction (90 direction).

In some embodiments, the fibers of the composite tape (CFT) of at least two layers of the roofing shingles 10, 110, 210, 310, 410 extend in the first direction (0 direction), and the fibers of the composite tape (CFT) of at least two other layers extend in the 45 direction. In some embodiments, the fibers of the composite tape (CFT) of at least two layers of the roofing shingles 110, 210, 310, 410 extend in the first direction (0 direction), and the fibers of the composite tape (CFT) of at least two other layers extend 1 degree to 89 degrees.

In some embodiments, the fibers of the composite tape (CFT) of at least two layers of the roofing shingles 10, 110, 210, 310, 410 extend in the second direction (90 direction), and the fibers of the composite tape (CFT) of at least two other layers extend in the 45 direction. In some embodiments, the fibers of the composite tape (CFT) of at least two layers of the roofing shingles 110, 210, 310, 410 extend in the second direction (90 direction), and the fibers of the composite tape (CFT) of at least two other layers extend 1 degree to 89 degrees.

Figure 13A:
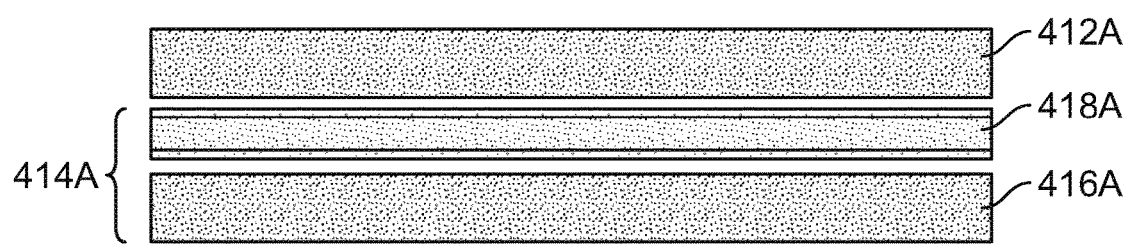
Figure 13B:
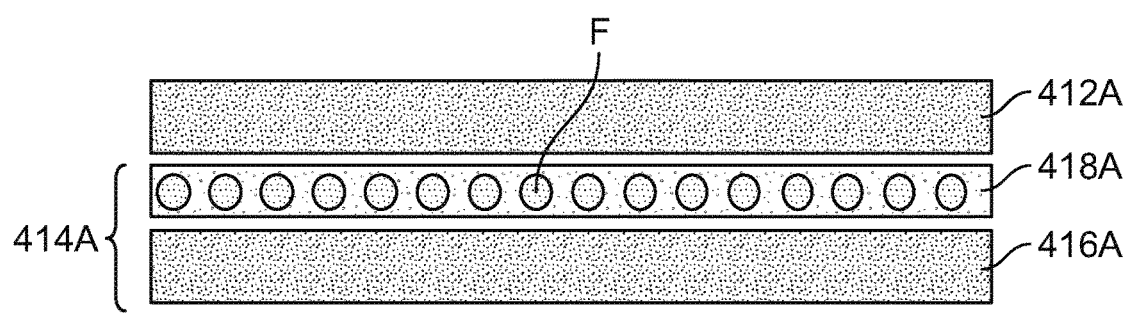

FIGS. 13A and 13B show some embodiments of a roofing shingle 410A. In some embodiments, the roofing shingle 410A is similar in structure and function to those of the roofing shingle 10 except as noted below. In some embodiments, the roofing shingle 410A includes a cap layer 412A and a core layer 414A. In some embodiments, the core layer 414A includes a first layer 416A and a second layer 418A. In some embodiments, the second layer 418A is between the cap layer 412A and the first layer 416A. In some embodiments, the first layer 416A is composed of a polymer. In some embodiments, the second layer 418A is composed of a continuous fiber thermoplastic composite tape (CFT). In some embodiments, as shown in FIG. 13A, the fibers of the composite tape (CFT) of the second layer 418A extend in the first direction (0 direction). In some embodiments, as shown in FIG. 13B, the fibers of the composite tape (CFT) of the second layer 418A extend in the second direction (90 direction).

Figure 13C:
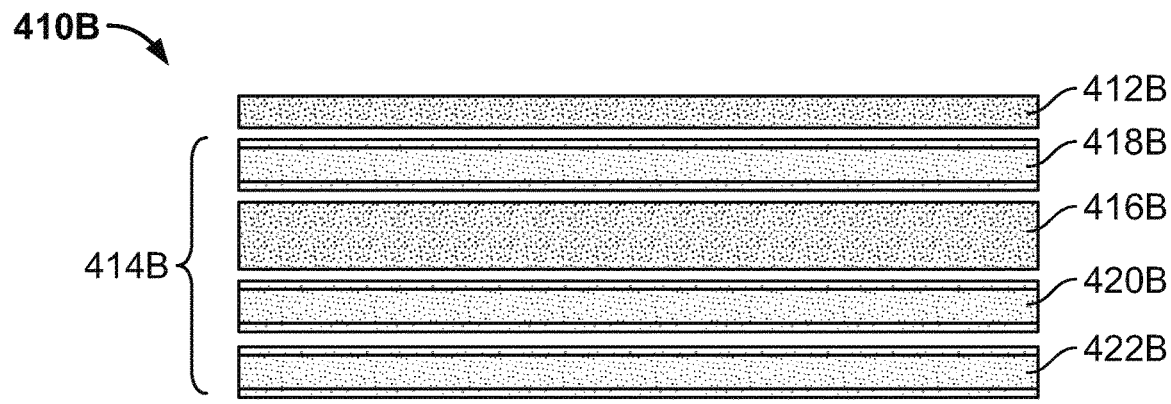
Figure 13D:
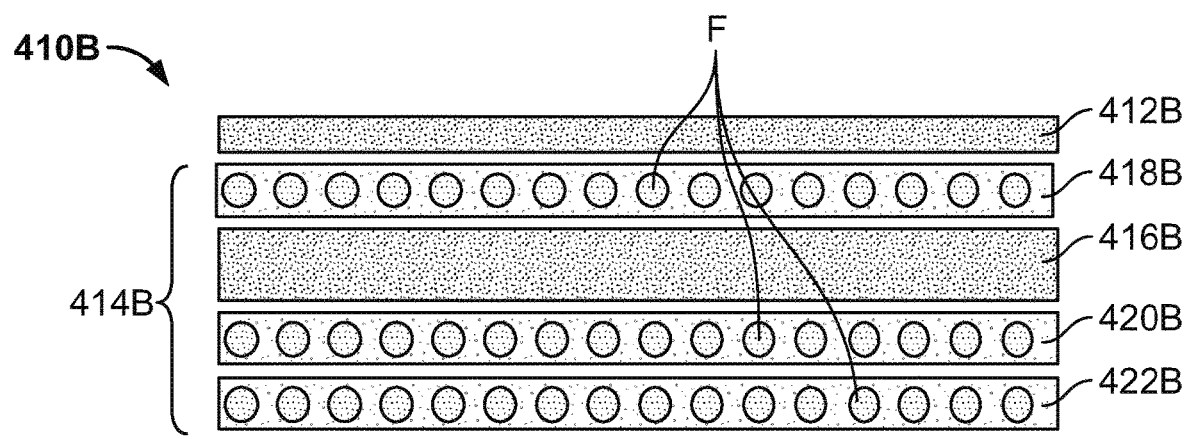

FIGS. 13C and 13D show some embodiments of a roofing shingle 410B. In some embodiments, the roofing shingle 410B is similar in structure and function to those of the roofing shingle 410A except as noted below. In some embodiments, the roofing shingle 410B includes a cap layer 412B and a core layer 414B. In some embodiments, the core layer 414B includes a first layer 416B, a second layer 418B between the cap layer 412B and the first layer 416B, a third layer 420B below the first layer 416B, and a fourth layer 422B below the third layer 420B. In some embodiments, the first layer 416B is composed of a polymer. In some embodiments, the second layer 418B is composed of a continuous fiber thermoplastic composite tape (CFT). In some embodiments, the third layer 422B is composed of a continuous fiber thermoplastic composite tape (CFT). In some embodiments, the fourth layer 422B is composed of a continuous fiber thermoplastic composite tape (CFT). In some embodiments, as shown in FIG. 13C, the fibers of the composite tape (CFT) of each of the second layer 418B, the third layer 420B, and the fourth layer 422B extend in the first direction (0 direction). In some embodiments, as shown in FIG. 13D, the fibers of the composite tape (CFT) of each of the second layer 418B, the third layer 420B, and the fourth layer 422B extend in the second direction (90 direction). In some embodiments, the fibers of the composite tape (CFT) of one or more of the second layer 418B, the third layer 420B, and the fourth layer 422B extend in the first direction (0 direction) and one or more of the second layer 418B, the third layer 420B, and the fourth layer 422B extend in the second direction (90 direction) in various combinations thereof.

In some embodiments, the fibers of the composite tape (CFT) of one or more of the second layer 418B, the third layer 420B, and the fourth layer 422B extend in the 45 direction. In some embodiments, the fibers of the composite tape (CFT) of one or more of the second layer 418B, the third layer 420B, and the fourth layer 422B extend 1 degree to 89 degrees.

Figure 13E:
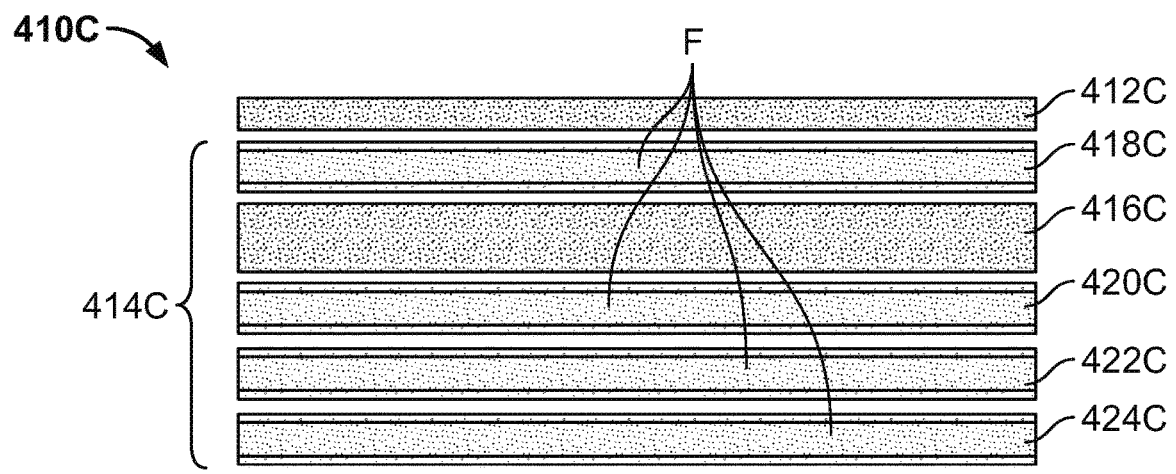
Figure 13F:
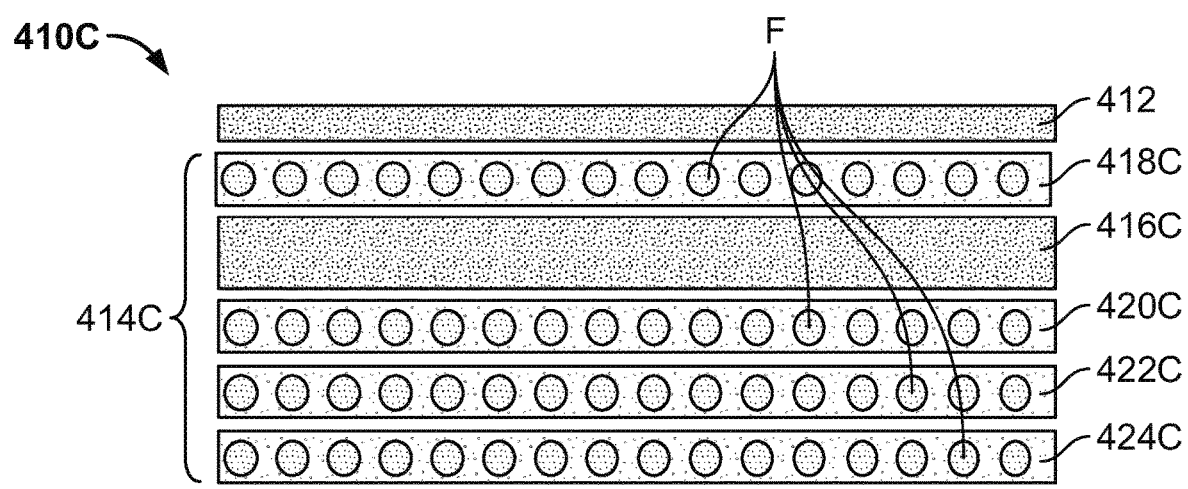

FIGS. 13E and 13F show some embodiments of a roofing shingle 410C. In some embodiments, the roofing shingle 410C is similar in structure and function to those of the roofing shingle 410B except as noted below. In some embodiments, the roofing shingle 410C includes a cap layer 412C and a core layer 414C. In some embodiments, the core layer 414C includes a first layer 416C, a second layer 418C between the cap layer 412C and the first layer 416C, a third layer 420C below the first layer 416C, a fourth layer 422C below the third layer 420C, and a fifth layer 424C below the fourth layer 422C. In some embodiments, the first layer 416C is composed of a polymer. In some embodiments, the second layer 418C is composed of a continuous fiber thermoplastic composite tape (CFT). In some embodiments, the third layer 422C is composed of a continuous fiber thermoplastic composite tape (CFT). In some embodiments, the fourth layer 422C is composed of a continuous fiber thermoplastic composite tape (CFT). In some embodiments, the fifth layer 424C is composed of a continuous fiber thermoplastic composite tape (CFT). In some embodiments, as shown in FIG. 13E, the fibers of the composite tape (CFT) of each of the second layer 418C, the third layer 420C, the fourth layer 422C and the fifth layer 424C extend in the first direction (0 direction). In some embodiments, as shown in FIG. 13F, the fibers of the composite tape (CFT) of each of the second layer 418C, the third layer 420C, the fourth layer 422C and the fifth layer 424C extend in the second direction (90 direction). In some embodiments, the fibers of the composite tape (CFT) of one or more of the second layer 418C, the third layer 420C, the fourth layer 422C and the fifth layer 424C extend in the first direction (0 direction) and one or more of the second layer 418C, the third layer 420C, the fourth layer 422C and the fifth layer 424C extend in the second direction (90 direction) in various combinations thereof.

Figure 14:
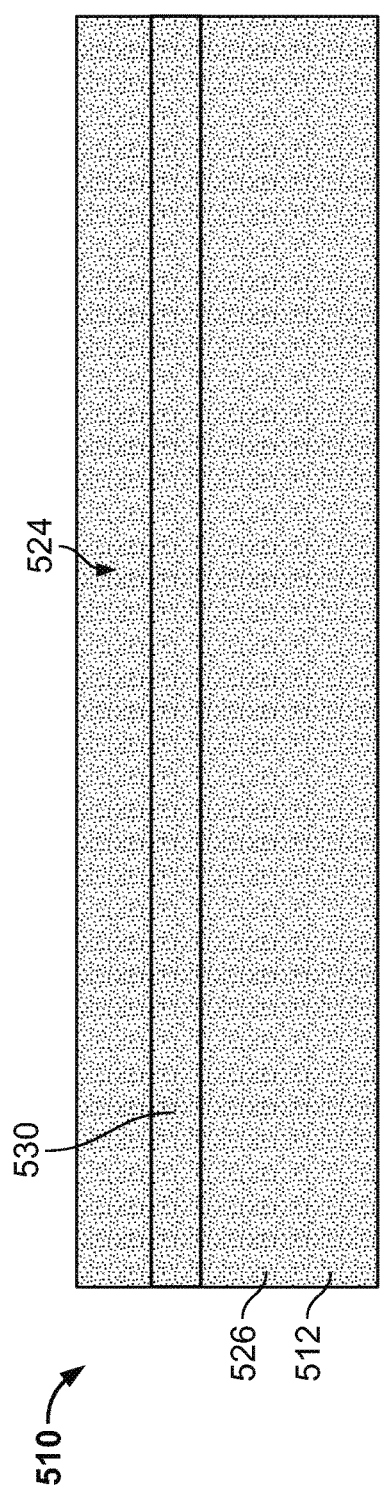
FIGS. 14 through 16 show some embodiments of a roofing shingle.
Figure 15:
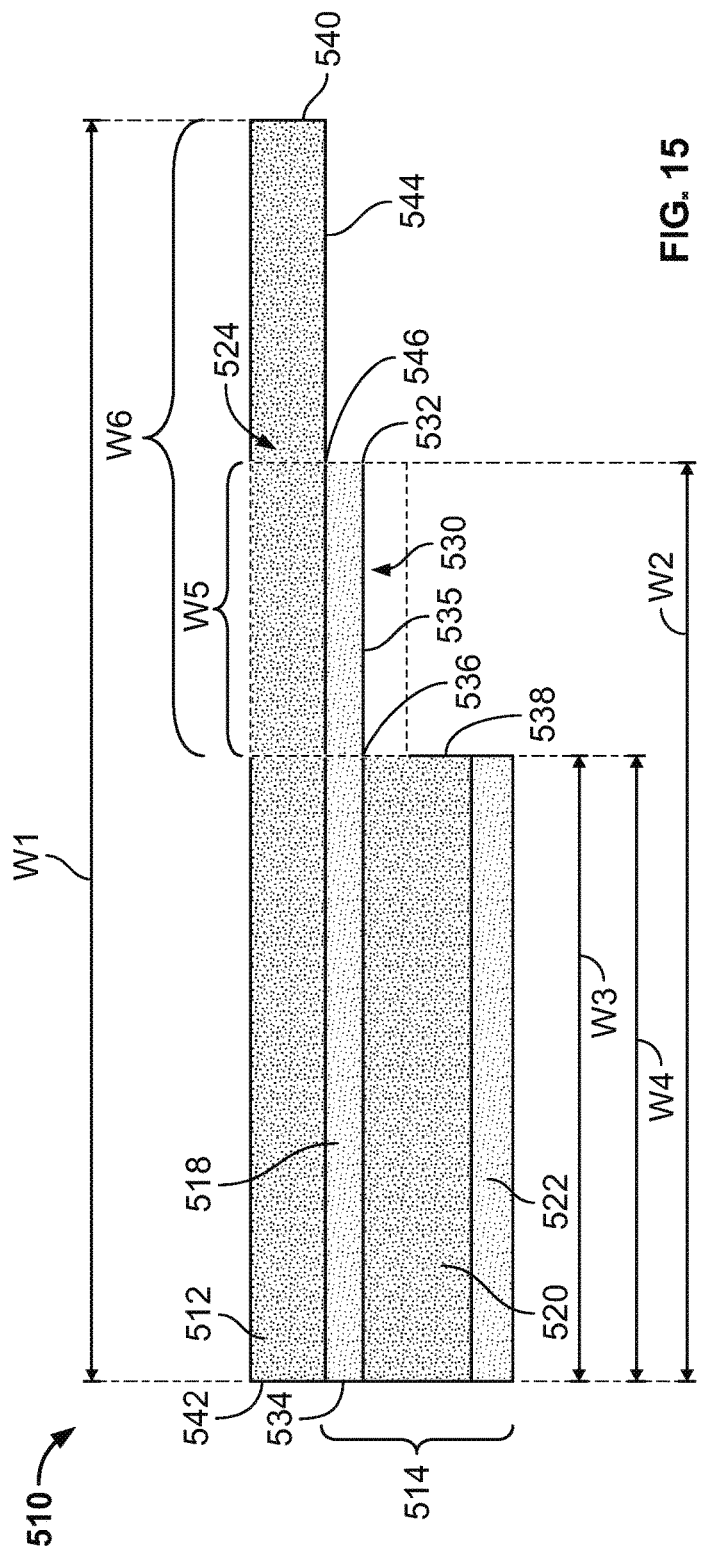
Figure 16:
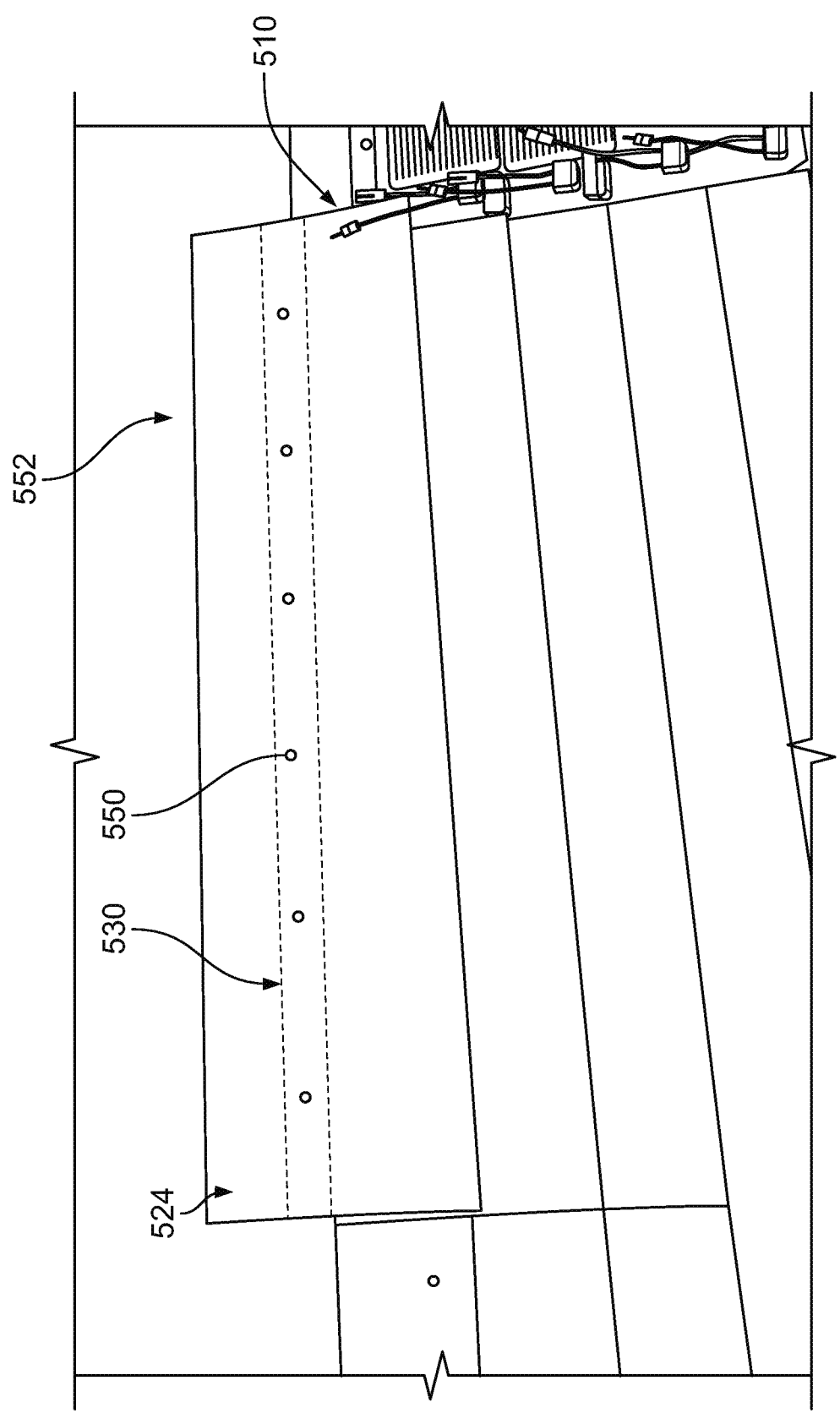

In some embodiments, the fibers of the composite tape (CFT) of one or more of the second layer 418C, the third layer 420C, the fourth layer 422C, and the fifth layer 424C extend in the 45 direction. In some embodiments, the fibers of the composite tape (CFT) of one or more of the second layer 418C, the third layer 420C, the fourth layer 422C, and the fifth layer 424C extend 1 degree to 89 degrees. FIGS. 14 through 16 show some embodiments of a roofing shingle 510. The roofing shingle 510 is similar in structure and function to those of the roofing shingle 10 except as noted below. In some embodiments, the roofing shingle 510 includes a cap layer 512 and a core layer 514. In some embodiments, the core layer 514 includes a first layer 518, a second layer 520, and a third layer 522. In some embodiments, the third layer 522 is between the first layer 518 and the second layer 520.

In some embodiments, the cap layer 512 has a thickness of 10 mil to 50 mil. In some embodiments, the first layer 518 of the core layer 514 has a thickness of 4 mil to 15 mil. In some embodiments, the second layer 520 of the core layer 514 has a thickness of 4 mil to 15 mil. In some embodiments, the third layer 522 of the core layer 514 has a thickness of 20 mil to 100 mil. In some embodiments, the aforesaid thicknesses of each of the cap layer 512, the first layer 518, the second layer 520, and the third layer 522 has a thickness in the ranges as described above with respect to the cap layer 12, the first layer 18, the second layer 20, and the third layer 22, respectively.

In some embodiments, the cap layer 512 has a width W1. In some embodiments, the width W1 of the cap layer 512 is 300 mm to 500 mm. In some embodiments, the width W1 of the cap layer 512 is 300 mm to 450 mm. In some embodiments, the width W1 of the cap layer 512 is 300 mm to 400 mm. In some embodiments, the width W1 of the cap layer 512 is 300 mm to 350 mm. In some embodiments, the width W1 of the cap layer 512 is 350 mm to 500 mm. In some embodiments, the width W1 of the cap layer 512 is 350 mm to 450 mm. In some embodiments, the width W1 of the cap layer 512 is 350 mm to 400 mm. In some embodiments, the width W1 of the cap layer 512 is 400 mm to 500 mm. In some embodiments, the width W1 of the cap layer 512 is 400 mm to 450 mm. In some embodiments, the width W1 of the cap layer 512 is 450 mm to 500 mm. In some embodiments, the width W1 of the cap layer 512 is 300 mm. In some embodiments, the width W1 of the cap layer 512 is 350 mm. In some embodiments, the width W1 of the cap layer 512 is 400 mm. In some embodiments, the width W1 of the cap layer 512 is 450 mm. In some embodiments, the width W1 of the cap layer 512 is 500 mm.

In some embodiments, the first layer 518 has a width W2. In some embodiments, the width W2 of the first layer 518 is 200 mm to 400 mm. In some embodiments, the width W2 of the first layer 518 is 200 mm to 350 mm. In some embodiments, the width W2 of the first layer 518 is 200 mm to 300 mm. In some embodiments, the width W2 of the first layer 518 is 200 mm to 250 mm. In some embodiments, the width W2 of the first layer 518 is 250 mm to 400 mm. In some embodiments, the width W2 of the first layer 518 is 250 mm to 350 mm. In some embodiments, the width W2 of the first layer 518 is 250 mm to 300 mm. In some embodiments, the width W2 of the first layer 518 is 300 mm to 400 mm. In some embodiments, the width W2 of the first layer 518 is 300 mm to 350 mm. In some embodiments, the width W2 of the first layer 518 is 350 mm to 400 mm. In some embodiments, the width W2 of the first layer 518 is 200 mm. In some embodiments, the width W2 of the first layer 518 is 250 mm. In some embodiments, the width W2 of the first layer 518 is 300 mm. In some embodiments, the width W2 of the first layer 518 is 350 mm. In some embodiments, the width W2 of the first layer 518 is 400 mm.

In some embodiments, the second layer 520 has a width W3. In some embodiments, the width W3 of the second layer 520 is 100 mm to 300 mm. In some embodiments, the width W3 of the second layer 520 is 100 mm to 250 mm. In some embodiments, the width W3 of the second layer 520 is 100 mm to 200 mm. In some embodiments, the width W3 of the second layer 520 is 100 mm to 150 mm. In some embodiments, the width W3 of the second layer 520 is 150 mm to 300 mm. In some embodiments, the width W3 of the second layer 520 is 150 mm to 250 mm. In some embodiments, the width W3 of the second layer 520 is 150 mm to 200 mm. In some embodiments, the width W3 of the second layer 520 is 200 mm to 300 mm. In some embodiments, the width W3 of the second layer 520 is 200 mm to 250 mm. In some embodiments, the width W3 of the second layer 520 is 250 mm to 300 mm. In some embodiments, the width W3 of the second layer 520 is 100 mm. In some embodiments, the width W3 of the second layer 520 is 150 mm. In some embodiments, the width W3 of the second layer 520 is 200 mm. In some embodiments, the width W3 of the second layer 520 is 250 mm. In some embodiments, the width W3 of the second layer 520 is 300 mm.

In some embodiments, the second layer 522 has a width W4. In some embodiments, the width W4 of the second layer 522 is 100 mm to 300 mm. In some embodiments, the width W4 of the second layer 522 is 100 mm to 250 mm. In some embodiments, the width W4 of the second layer 522 is 100 mm to 200 mm. In some embodiments, the width W4 of the second layer 522 is 100 mm to 150 mm. In some embodiments, the width W4 of the second layer 522 is 150 mm to 300 mm. In some embodiments, the width W4 of the second layer 522 is 150 mm to 250 mm. In some embodiments, the width W4 of the second layer 522 is 150 mm to 200 mm. In some embodiments, the width W4 of the second layer 522 is 200 mm to 300 mm. In some embodiments, the width W4 of the second layer 522 is 200 mm to 250 mm. In some embodiments, the width W4 of the second layer 522 is 250 mm to 300 mm. In some embodiments, the width W4 of the second layer 522 is 100 mm. In some embodiments, the width W4 of the second layer 522 is 150 mm. In some embodiments, the width W4 of the second layer 522 is 200 mm. In some embodiments, the width W4 of the second layer 522 is 250 mm. In some embodiments, the width W4 of the second layer 522 is 300 mm.

In some embodiments, the width W1 of the cap layer 512 is greater than the width W2 of the first layer 518. In some embodiments, the width W1 of the cap layer 512 is greater than the width W3 of the second layer 520. In some embodiments, the width W1 of the cap layer 512 is greater than the width W4 of the third layer 522. In some embodiments, the width W2 of the first layer 518 is greater than the width W3 of the second layer 520. In some embodiments, the width W2 of the first layer 518 is greater than the width W4 of the third layer 522.

In some embodiments, the width W3 of the second layer 520 is greater than the width W4 of the third layer 522. In some embodiments, the width W3 of the second layer 520 is less than the width W4 of the third layer 522. In some embodiments, the width W3 of the second layer 520 is equal to the width W4 of the third layer 522. In some embodiments, the width W3 of the second layer 520 is substantially equal to the width W4 of the third layer 522.

In some embodiments, the width W3 of the second layer 520 is less than the width W2 of the first layer 518. In some embodiments, the width W3 of the second layer 520 is greater than the width W2 of the first layer 522. In some embodiments, the width W3 of the second layer 520 is equal to the width W2 of the first layer 518. In some embodiments, the width W3 of the second layer 520 is substantially equal to the width W2 of the first layer 518.

In some embodiments, the width W4 of the third layer 522 is less than the width W2 of the first layer 518. In some embodiments, the width W4 of the third layer 522 is greater than the width W2 of the first layer 522. In some embodiments, the width W4 of the third layer 522 is equal to the width W2 of the first layer 518. In some embodiments, the width W4 of the third layer 522 is substantially equal to the width W2 of the first layer 518.

In some embodiments, the width W3 of the second layer 520 is less than the width W1 of the cap layer 512. In some embodiments, the width W3 of the second layer 520 is greater than the width W1 of the cap layer 512. In some embodiments, the width W3 of the second layer 520 is equal to the width W1 of the cap layer 512. In some embodiments, the width W3 of the second layer 520 is substantially equal to the width W1 of the cap layer 512.

In some embodiments, the width W4 of the third layer 522 is less than the width W1 of the cap layer 512. In some embodiments, the width W4 of the third layer 522 is greater than width W1 of the cap layer 512. In some embodiments, the width W4 of the third layer 522 is equal to the width W1 of the cap layer 512. In some embodiments, the width W4 of the third layer 522 is substantially equal to the width W1 of the cap layer 512.

In some embodiments, each of the width W3 of the second layer 520 and the width W4 of the third layer 522 is less than the width W2 of the first layer 518. In some embodiments, each of the width W3 of the second layer 520 and the width W4 of the third layer 522 is greater than the width W2 of the first layer 522. In some embodiments, each of the width W3 of the second layer 520 and the width W4 of the third layer 522 is equal to the width W2 of the first layer 518. In some embodiments, each of the width W3 of the second layer 520 and the width W4 of the third layer 522 is substantially equal to the width W2 of the first layer 518. In some embodiments, each of the width W3 of the second layer 520 and the width W4 of the third layer 522 is less than the width W1 of the cap layer 512. In some embodiments, each of the width W3 of the second layer 520 and the width W4 of the third layer 522 is greater than the width W1 of the cap layer 512. In some embodiments, each of the width W3 of the second layer 520 and the width W4 of the third layer 522 is equal to the width W1 of the cap layer 512. In some embodiments, each of the width W3 of the second layer 520 and the width W4 of the third layer 522 is substantially equal to the width W1 of the cap layer 512.

In some embodiments, the roofing shingle 510 includes a headlap portion 524 and a reveal portion 526. In some embodiments, the headlap portion 524 includes the cap layer 512. In some embodiments, the headlap portion 524 includes the cap layer 512 and the second layer 520. In some embodiments, the roofing shingle 510 includes a nailing zone 530. In some embodiments, the nailing zone 530 is between the headlap portion 524 and the reveal portion 526.

In some embodiments, the first layer 518 includes a first end 532, a second end 534 opposite the first end 532, and a first surface 535 extending from the first end 532 to a location 536 between the first end 532 and the second end 534. In some embodiments, the nailing zone 530 extends from the first end 532 to the first location 536. In some embodiments, the nailing zone 530 extends between the first end 532 and the first location 536. In some embodiments, the first location 536 is proximate to a first end 538 of the second layer 520.

In some embodiments, the nailing zone 530 has a width W5. In some embodiments, the width W5 is 10 mm to 400 mm. In some embodiments, the width W5 is 10 mm to 350 mm. In some embodiments, the width W5 is 10 mm to 300 mm. In some embodiments, the width W5 is mm to 250 mm. In some embodiments, the width W5 is 10 mm to 200 mm. In some embodiments, the width W5 is 10 mm to 150 mm. In some embodiments, the width W5 is 10 mm to 100 mm. In some embodiments, the width W5 is 10 mm to 50 mm. In some embodiments, the width W5 is 50 mm to 400 mm. In some embodiments, the width W5 is 50 mm to 350 mm. In some embodiments, the width W5 is 50 mm to 300 mm. In some embodiments, the width W5 is mm to 250 mm. In some embodiments, the width W5 is 50 mm to 200 mm. In some embodiments, the width W5 is 50 mm to 150 mm. In some embodiments, the width W5 is 50 mm to 100 mm. In some embodiments, the width W5 is 100 mm to 400 mm. In some embodiments, the width W5 is 100 mm to 350 mm. In some embodiments, the width W5 is 100 mm to 300 mm. In some embodiments, the width W5 is 100 mm to 250 mm. In some embodiments, the width W5 is 100 mm to 200 mm. In some embodiments, the width W5 is 100 mm to 150 mm. In some embodiments, the width W5 is 150 mm to 400 mm. In some embodiments, the width W5 is 150 mm to 350 mm. In some embodiments, the width W5 is 150 mm to 300 mm. In some embodiments, the width W5 is 150 mm to 250 mm. In some embodiments, the width W5 is 150 mm to 200 mm. In some embodiments, the width W5 is 200 mm to 400 mm. In some embodiments, the width W5 is 200 mm to 350 mm. In some embodiments, the width W5 is 200 mm to 300 mm. In some embodiments, the width W5 is 200 mm to 250 mm. In some embodiments, the width W5 is 250 mm to 400 mm. In some embodiments, the width W5 is 250 mm to 350 mm. In some embodiments, the width W5 is 250 mm to 300 mm. In some embodiments, the width W5 is 300 mm to 400 mm. In some embodiments, the width W5 is 300 mm to 350 mm. In some embodiments, the width W5 is 350 mm to 400 mm. In some embodiments, the width W5 is 10 mm. In some embodiments, the width W5 is 50 mm. In some embodiments, the width W5 is 100 mm. In some embodiments, the width W5 is 150 mm. In some embodiments, the width W5 is 200 mm. In some embodiments, the width W5 is 250 mm. In some embodiments, the width W5 is 300 mm. In some embodiments, the width W5 is 350 mm. In some embodiments, the width W5 is 400 mm.

In some embodiments, the roofing shingle 510 is configured to receive at least one fastener 550 within the nailing zone 530 for installing the roofing shingle 510 to a roof deck 552. In some embodiments, the roofing shingle 510 is configured to receive the at least one fastener through the first surface 535 of the first layer 518 and through the cap layer 512 within the nailing zone 530. In some embodiments, the at least one fastener includes a plurality of fasteners. In some embodiments, the fasteners are roofing nails, rivets, staples, or screws.

In some embodiments, the cap layer 512 includes a first end 540, a second end opposite the first end 542 and a first surface 544 extending between the first end 540 and a second location 546 between the first end 540 and the second end 542. In some embodiments, the nailing zone 530 extends from the first end 540 of the cap layer 512 to the second location 546. In some embodiments, the nailing zone 530 extends between the first end 540 of the cap layer 512 and the second location 546. In some embodiments, the second location 546 is proximate to the first end 532 of the first layer 518.

In some embodiments, the nailing zone 530 has a width W6. In some embodiments, the width W6 is 10 mm to 300 mm. In some embodiments, the width W6 is 10 mm to 250 mm. In some embodiments, the width W6 is 10 mm to 200 mm. In some embodiments, the width W6 is mm to 150 mm. In some embodiments, the width W6 is 10 mm to 100 mm. In some embodiments, the width W6 is 10 mm to 50 mm. In some embodiments, the nailing zone 530 has a width W6. In some embodiments, the width W6 is 50 mm to 300 mm. In some embodiments, the width W6 is 50 mm to 250 mm. In some embodiments, the width W6 is 50 mm to 200 mm. In some embodiments, the width W6 is 50 mm to 150 mm. In some embodiments, the width W6 is 50 mm to 100 mm. In some embodiments, the nailing zone 530 has a width W6. In some embodiments, the width W6 is 100 mm to 300 mm. In some embodiments, the width W6 is 100 mm to 250 mm. In some embodiments, the width W6 is 100 mm to 200 mm. In some embodiments, the width W6 is 100 mm to 150 mm. In some embodiments, the nailing zone 530 has a width W6. In some embodiments, the width W6 is 150 mm to 300 mm. In some embodiments, the width W6 is 150 mm to 250 mm. In some embodiments, the width W6 is 150 mm to 200 mm. In some embodiments, the nailing zone 530 has a width W6. In some embodiments, the width W6 is 200 mm to 300 mm. In some embodiments, the width W6 is 200 mm to 250 mm. In some embodiments, the nailing zone 530 has a width W6. In some embodiments, the width W6 is 250 mm to 300 mm. In some embodiments, the width W6 is 10 mm. In some embodiments, the width W6 is 50 mm. In some embodiments, the width W6 is 100 mm. In some embodiments, the width W6 is 150 mm. In some embodiments, the width W6 is 200 mm. In some embodiments, the width W6 is 250 mm. In some embodiments, the width W6 is 300 mm.

In some embodiments, the roofing shingle 510 is configured to receive the plurality of fasteners through the first surface 544 of the cap layer 512 within the nailing zone 530. It should be understood that, in some embodiments, each of the roofing shingles 10, 110, 210, 310, 410 can be configured to include the structure and function of the cap layer 512 and the core layer 514, including the nailing zone 530, as described above with respect to the roofing shingle 510.

What is claimed is:

1. A system, comprising:
 a plurality of photovoltaic modules configured to be installed on a roof deck; and
 a plurality of roofing shingles, wherein each of the plurality of roofing shingles includes:
  a cap layer,
   wherein the cap layer includes a first end, a second end opposite the first end, a first edge extending from the first end to the second end, and a second edge opposite the first edge and extending from the first end to the second end,
   wherein the cap layer includes an upper surface and a lower surface opposite the upper surface,
   wherein the upper surface from the first end to the second end and from the first edge to the second edge is a non-porous surface,
   wherein the cap layer is composed of a first polymer material, and a core layer underneath the cap layer, wherein the core layer includes:
    a first layer, wherein the first layer is composed of a continuous fiber thermoplastic composite tape (CFT), wherein the first layer is juxtaposed with the lower surface of the cap layer, a second layer, wherein the second layer is composed of a continuous fiber thermoplastic composite tape (CFT), and a third layer between the first layer and the second layer, wherein the third layer is composed of a second polymer material.

2. The system of claim 1, wherein the first polymer material is thermoplastic polyolefin (TPO).

3. The system of claim 2, wherein the second polymer material is thermoplastic polyolefin (TPO).

4. The system of claim 1, wherein the first layer is composed of a polypropylene continuous fiber, unidirectional reinforced thermoplastic composite tape (CFT).

5. The system of claim 1, wherein the second layer is composed of composed of a polypropylene continuous fiber, unidirectional reinforced thermoplastic composite tape (CFT).

6. The system of claim 1, wherein fibers of the continuous fiber thermoplastic composite tape (CFT) of the first layer extend in a first direction along a longitudinal axis of the roofing shingle, and wherein the fibers of the continuous fiber thermoplastic composite tape (CFT) of the second layer extend in the first direction.

7. The system of claim 1, wherein fibers of the continuous fiber thermoplastic composite tape (CFT) of the first layer extend in a first direction transverse from a longitudinal axis of the roofing shingle, and wherein the fibers of the continuous fiber thermoplastic composite tape (CFT) of the second layer extend in the first direction.

8. The system of claim 1, wherein fibers of the continuous fiber thermoplastic composite tape (CFT) of the first layer extend in a first direction along a longitudinal axis of the roofing shingle, and wherein the fibers of the continuous fiber thermoplastic composite tape (CFT) of the second layer extend in a second direction transverse from the first direction.

9. The system of claim 1, wherein the cap layer has a thickness of 10 mil to 60 mil.

10. The system of claim 9, wherein each of the first layer of the core layer and the second layer of the core layer has a thickness of 4 mil to 15 mil.

11. The system of claim 1, wherein the roofing shingle has a thickness of 35 mil to 200 mil.

12. The system of claim 1, wherein the cap layer includes a first surface and a pattern printed on the first surface.

13. The system of claim 12, wherein the roofing shingle includes a headlap portion, wherein the headlap portion includes the cap layer and the second layer.

14. The system of claim 13, wherein the headlap portion includes a nailing zone.

15. The system of claim 14, wherein the first layer includes a first end, a second end opposite the first end, wherein the nailing zone extends from the first end to a first location between the first end and the second end.

16. The system of claim 1, further comprising at least a fourth layer below the second layer, wherein the at least a fourth layer is composed of a continuous fiber thermoplastic composite tape (CFT).

17. The system of claim 16, wherein the at least a fourth layer includes a fourth layer and a fifth layer, wherein the fourth layer is below the second layer, and wherein the fifth layer is below the fourth layer.

18. A roofing shingle, comprising:

a cap layer,
wherein the cap layer includes a first end, a second end opposite the first end, a first edge extending from the first end to the second end, and a second edge opposite the first edge and extending from the first end to the second end,
wherein the cap layer includes an upper surface and a lower surface opposite the upper surface,
wherein the upper surface from the first end to the second end and from the first edge to the second edge is a non-porous surface,
wherein the cap layer is composed of thermoplastic polyolefin (TPO),
wherein the cap layer has a thickness of 10 mil to 50 mil; and a core layer underneath the cap layer, wherein the core layer includes
a first layer,
wherein the first layer is composed of a polypropylene continuous fiber, unidirectional reinforced thermoplastic composite tape (CFT),
wherein the first layer has a thickness of 4 mil to 15 mil,
wherein the first layer is juxtaposed with the lower surface of the cap layer,
a second layer,
wherein the second layer is composed of a polypropylene continuous fiber, unidirectional reinforced thermoplastic composite tape (CFT),
wherein the second layer has a thickness of 4 mil to 15 mil, and
a third layer between the first layer and the second layer,
wherein the third layer is composed of thermoplastic polyolefin, and
wherein the third layer has a thickness of 20 mil to 100 mil,
wherein the thickness of the third layer is greater than a combined thickness of the thickness of the first layer, the thickness of the second layer, and the thickness of the cap layer, wherein the roofing shingle includes a flexural modulus that is higher than a flexural modulus of a roofing shingle that does not include the first layer and the second layer, and wherein the roofing shingle includes a coefficient of thermal expansion (CTE) that is lower than a coefficient of thermal expansion (CTE) of a roofing shingle that does not include the first layer and the second layer.

* * * * *